United States Patent
Shichino et al.

(10) Patent No.: US 9,954,582 B2
(45) Date of Patent: Apr. 24, 2018

(54) POWER TRANSMITTING APPARATUS, CONTROL METHOD, AND COMPUTER READABLE STORAGE MEDIUM

(71) Applicant: CANON KABUSHIKI KAISHA, Tokyo (JP)

(72) Inventors: Takahiro Shichino, Tokyo (JP); Tadashi Eguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 355 days.

(21) Appl. No.: 14/244,380

(22) Filed: Apr. 3, 2014

(65) Prior Publication Data

US 2014/0300199 A1    Oct. 9, 2014

(30) Foreign Application Priority Data

Apr. 4, 2013  (JP) ................................ 2013-078989
Mar. 4, 2014  (JP) ................................ 2014-041944

(51) Int. Cl.
*H04B 5/00*  (2006.01)
*H03F 1/02*  (2006.01)
*H03F 3/217*  (2006.01)
*H03F 3/24*  (2006.01)

(52) U.S. Cl.
CPC ......... *H04B 5/0037* (2013.01); *H03F 1/0244* (2013.01); *H03F 3/217* (2013.01); *H03F 3/24* (2013.01)

(58) Field of Classification Search
CPC .............................. H04B 5/0037; H03F 1/0244
See application file for complete search history.

(56) References Cited

U.S. PATENT DOCUMENTS

| | | |
|---|---|---|
| 7,944,294 B2 | 5/2011 | Jones et al. |
| 8,000,113 B2 | 8/2011 | Fonderie |
| 8,107,904 B2 | 1/2012 | Ahn et al. |
| 8,548,401 B2 * | 10/2013 | Sasaki ................. H03F 1/0233 455/114.2 |
| 8,855,559 B2 | 10/2014 | Von Novak, III et al. |
| 2001/0030580 A1 * | 10/2001 | Canyon ................. H03F 1/0211 330/285 |

(Continued)

FOREIGN PATENT DOCUMENTS

CN    101860250 A    10/2010
CN    102696164 A    9/2012

(Continued)

OTHER PUBLICATIONS

Office Action issued in CN201410136737.6, dated Nov. 6, 2015. English translation provided.

(Continued)

*Primary Examiner* — Daniel Kessie
(74) *Attorney, Agent, or Firm* — Rossi, Kimms & McDowell LLP

(57) ABSTRACT

A power transmitting apparatus that performs power transmission to a power receiving apparatus includes an amplifier including a switching element, receives a load power amount from the power receiving apparatus, detects a value for evaluating the efficiency of the amplifier, and based on the load power amount and the detected value for evaluating the efficiency, increases or reduces a voltage that is to be supplied to the amplifier.

18 Claims, 22 Drawing Sheets

(56) References Cited

U.S. PATENT DOCUMENTS

| | | |
|---|---|---|
| 2007/0249304 A1 | 10/2007 | Snelgrove et al. |
| 2012/0161538 A1* | 6/2012 | Kinoshita ............... H02J 17/00 307/104 |
| 2012/0287985 A1 | 11/2012 | Okamura et al. |
| 2012/0288019 A1 | 11/2012 | Okamura et al. |
| 2012/0306433 A1 | 12/2012 | Kim et al. |
| 2013/0154381 A1* | 6/2013 | Cain ....................... H02J 17/00 307/104 |
| 2013/0162051 A1* | 6/2013 | Michihata ............... H02J 5/005 307/104 |
| 2014/0175868 A1 | 6/2014 | Sakakibara et al. |

FOREIGN PATENT DOCUMENTS

| | | |
|---|---|---|
| JP | 08-191224 A | 7/1996 |
| JP | 2010-252497 A | 4/2010 |
| JP | 2012-146289 A | 8/2012 |
| JP | 2013-038634 A | 2/2013 |
| WO | 2007100682 A1 | 9/2007 |
| WO | 2009070730 A2 | 6/2009 |
| WO | 2013014521 A1 | 1/2013 |
| WO | 2013025623 A2 | 2/2013 |

OTHER PUBLICATIONS

Takehiro Imura et al, "Experimental Analysis of High Efficiency Power Transfer using Resonance of Magnetic Antennas for the Near Field", Proceedings of the IEE-Japan Industry Applications Society Conference II, Aug. 2008, p. 539-542).
Office Action issued in Japanese Patent Application No. 2014-041944 dated Dec. 15, 2017.
European Search Report issued in European Application No. 14159376.4 dated Sep. 28, 2017.
Extended European Search Report issued in European Appln. No. 14159376.4 dated Feb. 16, 2018.
Son et al. "Simultaneous Data and Power Transmission in Resonant Wireless Power System" Asia-Pacific Microwave Conference Proceedings. 2013:1,003-1,005.

* cited by examiner

F I G. 2
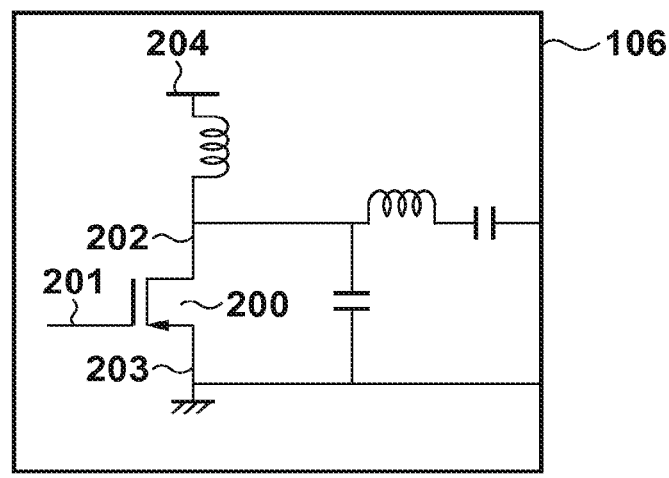
PRIOR ART

FIG. 3A

| | Vdd | SETTING VALUE | Pout | EFFICIENCY | Vout | OPTIMAL VALUE |
|---|---|---|---|---|---|---|
| 306a | 17V | 11.8W | 10W | 85% | 10V | 11.8W |
| 307a | 17V | 11.8W | 1W | 36% | 10V | 1.2W |
| 308a | 9V | 3.5W | 1W | 64% | 10V | 1.2W |
| 309a | 5V | 1.2W | 1W | 85% | 10V | 1.2W |

FIG. 3B

| | Vdd | SETTING VALUE | Pout | EFFICIENCY | Vout | OPTIMAL VALUE |
|---|---|---|---|---|---|---|
| 306b | 17V | 11.8W | 10W | 85% | 10V | 11.8W |
| 307b | 17V | 11.8W | 18W | 80% | 10V | 21.2W |
| 308b | 23V | 21.2W | 18W | 85% | 10V | 21.2W |

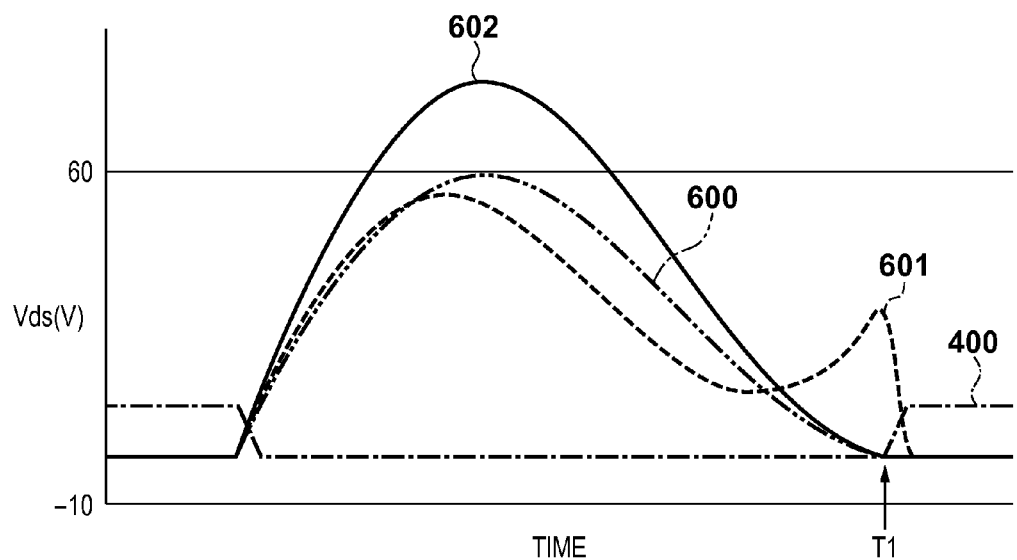

FIG. 13

| | Zin (1303) | STATE (1304) | POWER CONTROL (1305) |
|---|---|---|---|
| 1300 | 23ohm | STATE 1 | NONE |
| 1301 | LESS THAN 23 OHMS | STATE 2 | INCREASE Vdd |
| 1302 | GREATER THAN 23 OHMS | STATE 3 | REDUCE Vdd |

FIG. 14

| | Zin (1403) | Pout (1404) | SETTING VALUE (1405) | Vdd (1406) |
|---|---|---|---|---|
| 1400 | 134ohm | 1W | 1.2W | 5V |
| 1401 | 23ohm | 10W | 11.8W | 17V |
| 1402 | 13ohm | 18W | 21.2W | 23V |

F I G. 16

|  | | Vdd | SETTING VALUE | Pout | EFFICIENCY | Vout | GAP |
|---|---|---|---|---|---|---|---|
| 1606 | | 17V | 11.8W | 10W | 85% | 10V | 55mm |
| 1607 | | 17V | 11.8W | 18W | 44% | 10V | 95mm |
| 1608 | | 17V | 11.8W | 18W | 80% | 10V | 95mm |
| 1609 | | 23V | 21.2W | 18W | 85% | 10V | 95mm |
| 1610 | | 20V | 20.7W | 18W | 41% | 10V | 95mm |

POWER TRANSMITTING APPARATUS, CONTROL METHOD, AND COMPUTER READABLE STORAGE MEDIUM

BACKGROUND OF THE INVENTION

Field of the Invention

The present invention relates to a power transmitting apparatus and a method for controlling the same.

Description of the Related Art

In recent years, a wireless power transmission technique has been widely researched and developed. With this technique, power transmission efficiency decreases due to variation in power consumed by loads (hereinafter referred to as "load variation") and variation in distance between transmitting and receiving apparatuses (e.g., variation in distance between antennas. Hereinafter referred to as "gap variation") (Takehiro Imura et al, "Experimental Analysis of High Efficiency Power Transfer using Resonance of Magnetic Antennas for the Near Field", Proceedings of the IEE-Japan Industry Applications Society Conference II, August 2008, p. 539-542). Also, a technique of using a class E amplifier as a power transmitting apparatus has been developed as well (Japanese Patent Laid-Open No. 2012-146289). An example of the configuration of a class E amplifier 106 is shown in FIG. 2. The class E amplifier 106 is constituted by an N-channel MOSFET 200 (hereinafter referred to as "FET 200"), two inductors, and two capacitors. Also, the class E amplifier 106 includes a gate 201, a drain 202, and a source 203 in the FET 200 as terminals. The class E amplifier 106 switches a supplied DC voltage (hereinafter referred to as "Vdd") 204 using a pulse that is input to the gate 201, and converts it to an AC voltage.

The voltage waveform in the periphery of the FET 200 in the case where the class E amplifier 106 is applied to a power transmission system will be described next with reference to FIG. 4. FIG. 4 is a diagram showing variation over time in the voltage waveforms in the periphery of the FET 200, although the details thereof will be described in an embodiment. In FIG. 4, a dotted chain line 400 is the waveform of the voltage between the gate 201 and the source 203 (hereinafter referred to as "Vgs"). According to the dotted chain line 400, the FET 200 transitions to an off state at time T0 and is in the off state in the period from time T0 to time T1. Then, the FET 200 transitions to an on state at time T1. A double-dotted chain line 401 is the waveform of the voltage between the drain 202 and the source 203 when the class E amplifier 106 performs an ideal operation (hereinafter referred to as "Vds"). According to the double-dotted chain line 401, the Vds at time T1 when the FET 200 transitions to the on state is 0 Volts, and the slope of the Vds is also 0. Here, "slope" means a value obtained by differentiating the change in the Vds with respect to time.

Thus, the class E amplifier 106 causes the Vds to resonate in the period when the FET 200 is in the off state (from time T0 to time T1). Also, ideally, the FET 200 transitions to the on state when the Vds is 0 Volts, and the slope of the Vds is 0 (hereinafter referred to as "zero voltage switching"). This reduces switching loss and enables high-efficiency power conversion. Also, the output setting value (hereinafter referred to as the "setting value") of the class E amplifier 106 can be set by increasing or reducing the Vdd 204, and if the Vdd 204 is increased, the setting value is increased. Note that the times T1 written in the present description all indicate the time when the FET 200 transitions to the on state.

The voltage waveforms in the periphery of the FET 200 in the case where load variation or gap variation occurs will be described next with reference to FIG. 6. FIG. 6 is a diagram showing variation over time in the voltage waveforms in the periphery of the FET 200 in the case where load variation or gap variation occurs, although the details thereof will be described in the embodiments. A dotted line 601 is an example of the Vds waveform in the case where load variation or gap variation occurs. According to the dotted line 601, at time T1, the Vds is not 0 Volts, and the slope of the Vds is not 0. At this time, switching loss occurs in the FET 200 and efficiency decreases. Accordingly, it is necessary to resolve the problem of reduced efficiency that is caused by switching loss in the FET 200 if load variation or gap variation occurs.

SUMMARY OF THE INVENTION

The present invention has been made in view of the problem above and realizes a high-efficiency power transmission system regardless of load variation and gap variation in the power transmission system.

According to one aspect of the present invention, there is provided a power transmitting apparatus that performs power transmission to a power receiving apparatus, the power transmission apparatus comprising: an amplifier that includes a switching element; a detection unit configured to detect a value for evaluating the efficiency of the amplifier; and a power control unit configured to increase or reduce a voltage supplied to the amplifier based on the value for evaluating the efficiency that was detected by the detection unit.

Further features of the present invention will become apparent from the following description of exemplary embodiments (with reference to the attached drawings).

BRIEF DESCRIPTION OF THE DRAWINGS

FIG. 2 is a diagram showing the configuration of a class E amplifier.

FIGS. 3A and 3B are diagrams showing states of the power transmission system according to the first embodiment.

FIG. 6 is a diagram showing the Vds waveform in the case where power consumption has increased.

FIG. 7 is a diagram showing a determination table in the case where a detection unit has detected the Vds.

FIG. 13 is a diagram showing a determination table in the case where the detection unit has detected Zin.

FIG. 14 is a diagram showing a determination table that shows the relationship between the results of the detection performed by the detection unit and Vdd.

FIG. 16 is a diagram showing the configuration of a power transmission system according to a second embodiment.

DESCRIPTION OF THE EMBODIMENTS

The present invention will be described in detail below thereof with reference to the accompanying drawings. Note that the configurations shown in the embodiments below are merely examples and the present invention is not limited to the illustrated configurations.

First Embodiment

Figure 1:
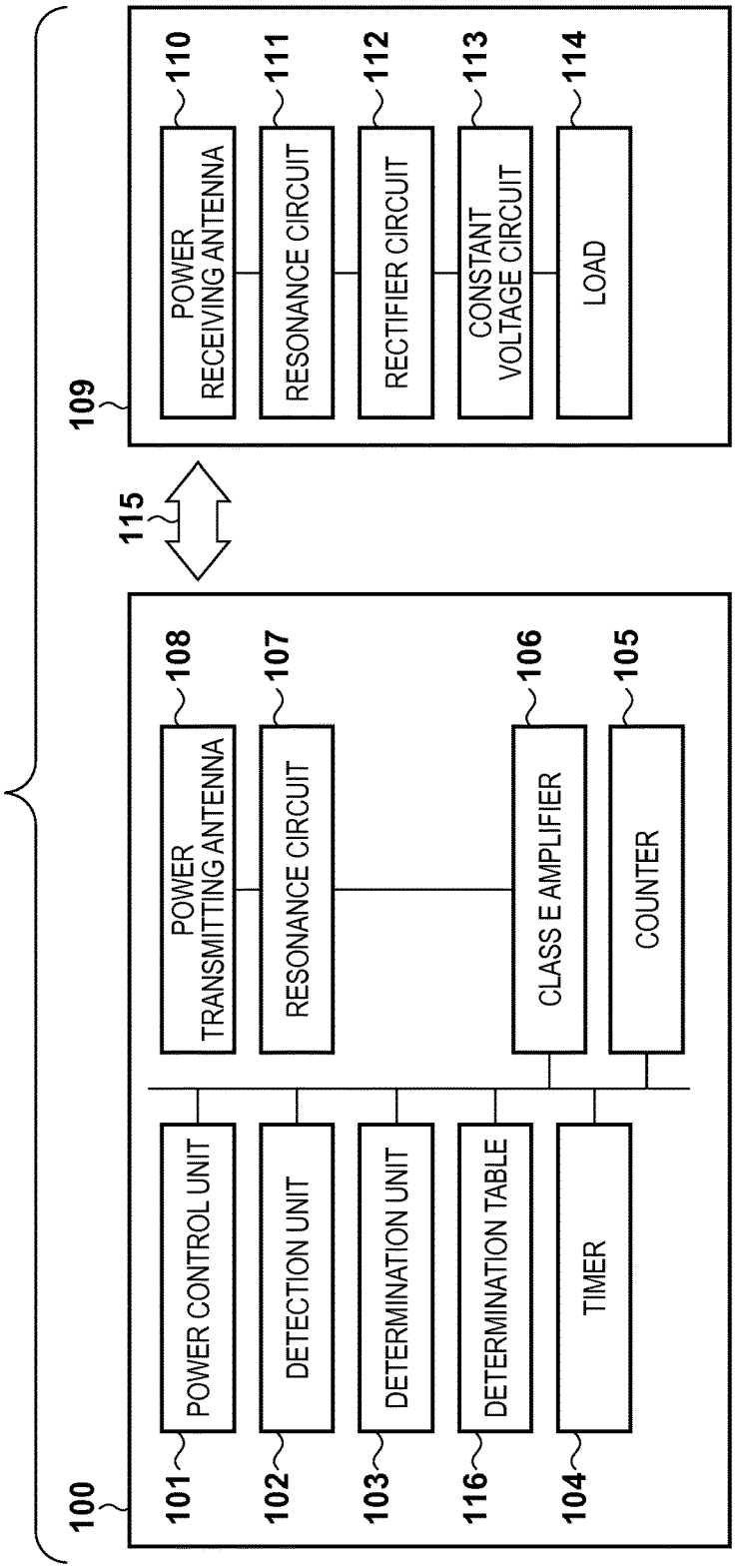
FIG. 1 is a diagram showing the configuration of a power transmission system according to a first embodiment.

The present embodiment will describe a case where load variation has occurred in a power transmission system. FIG. 1 is a diagram showing the configuration of a power transmission system according to the present embodiment. In FIG. 1, a power transmitting apparatus 100 transmits power to a power receiving apparatus 109 via a transmission path 115. In the power transmitting apparatus 100, a power control unit 101 has a function of controlling the power transmitted by the power transmitting apparatus 100, and performs power control in the present embodiment by increasing or reducing a DC voltage Vdd 204 that is connected to a class E amplifier 106. A detection unit 102 detects a Vds (a voltage between a drain 202 and a source 203) at time T1 in FIG. 4. A determination unit 103 references a determination table 116 based on the detection result of the detection unit 102 and determines the operation of the power control unit 101. The information stored in the determination table 116 and the operation of the determination unit 103 will be described in detail later. A timer 104 is used for suppressing the operation of the detection unit 102 until the power controlled by the power control unit 101 and the output from a later-described constant voltage circuit 113 are stable.

A counter 105 has a function of counting the number of times the power control unit 101 performs an operation and stops the power transmitting function of the power transmitting apparatus 100 if that number reaches an upper-limit value. Because of this, the counter 105 also has a function of storing the number of times the power control unit 101 has performed an operation (hereinafter referred to as the "present value") and the limit value. A resonance circuit 107 causes a power transmitting antenna 108, the transmission path 115, and a power receiving antenna 110 to resonate at the frequency of the AC voltage that is output from the class E amplifier 106, and matches the impedance between the class E amplifier 106 and the power transmitting antenna 108. The power transmitting antenna 108 transmits the power output from the resonance circuit 107 to the power receiving apparatus 109 via the transmission path 115.

On the other hand, after the power receiving antenna 110 and the resonance circuit 111 have received power in the power receiving apparatus 109, a rectifier circuit 112 converts the AC voltage output by the resonance circuit 111 into a DC voltage. The constant voltage circuit 113 converts the DC voltage supplied from the rectifier circuit 112 into a voltage value by which a load operates. A load 114 consumes power output by the constant voltage circuit 113. Note that in the present embodiment, the load 114 is operated at a voltage of 10 V.

FIGS. 3A and 3B are tables showing evaluations of the states of the power transmission system according to the present embodiment in the case where the power consumption of the load 114 changes. FIG. 3A shows a case where the power consumption of the load 114 decreases, and FIG. 3B shows a case where the power consumption of the load 114 increases. FIGS. 3A and 3B each show values indicating states (306a to 309a, 306b to 308b). Specifically, for each of the states 306a to 309a, FIG. 3A shows a Vdd (supplied DC voltage 204) 300a, a setting value 301a for the output of the class E amplifier 106, and power consumption (hereinafter referred to as "Pout") 302a of the load 114. Furthermore, for each state, FIG. 3A shows power transmission efficiency 303a for the power transmission system according to the present embodiment, a voltage value 304a supplied to the load 114 (hereinafter referred to as "Vout"), and an optimal value 305a for the setting value 301a. FIG. 3B is a table similar to FIG. 3A with respect to the states 306b to 308b. Note that the optimal value 305a is a value obtained by dividing Pout by the efficiency at the time of zero voltage switching.

In FIG. 3A, the state 306a and the state 309a are zero voltage switching states, and the setting value 301a and the optimal value 305a are equal in each state. Also, in FIG. 3B, the state 306b and the state 308b are zero voltage switching states, and the setting value 301b and the optimal value 305b are equal in both states.

Figure 4:
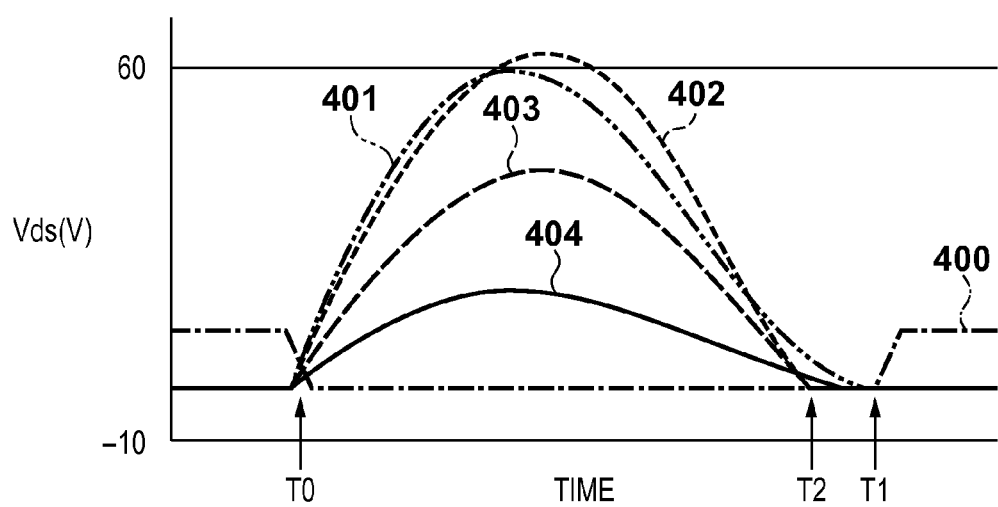
FIG. 4 is a diagram showing Vds waveforms in the case where power consumption has decreased.

FIG. 4 shows the Vds waveforms, which are the output waveforms of the FET, during the states 306a to 309a shown in FIG. 3A. FIG. 4 shows the Vds waveforms and the Vgs waveform in the case where the power consumption (Pout) of the load 114 decreases. As described above, the dotted chain line 400 is the Vgs waveform for transitioning between the on state and the off state. In FIG. 4, the Vds waveform during the state 306a in FIG. 3A is the double-dotted chain line 401, the Vds waveform during the state 307a is the dotted line 402, the Vds waveform during the state 308a is the broken line 403, and the Vds waveform during the state 309a is the solid line 404.

Also, FIG. 6 shows the Vds waveforms for 306b to 308b shown in FIG. 3B. FIG. 6 shows the Vds waveforms and the Vgs waveform in the case where the power consumption (Pout) of the load 114 increases. The dotted chain line 400 is the Vgs waveform, similarly to FIG. 4. In FIG. 6, the Vds waveform during the state 306b in FIG. 3B is the double-dotted chain line 600, the Vds waveform during the state 307b is the dotted line 601, and the Vds waveform during the state 308b is the solid line 602.

Operations of the power transmitting apparatus 100 according to the present embodiment will be described next with reference to FIG. 7. FIG. 7 shows an example of the determination table 116. The determination table 116 in FIG. 7 is used for the determination unit 103 to determine the operation of the power control unit 101 in the case where the detection unit 102 detects the Vds at time T1. In other words, the determination unit 103 uses the Vds detected by the detection unit 102 to reference the table 116 and thereby determine the state. In FIG. 7, a state 700 indicates the case where the detected Vds is 0 V. That is to say, it is a zero voltage switching state, and as described before, it is the state in which the setting value and the Pout are appropriate. This state is defined as "state 1" in the present embodiment. In the case of state 1, the determination unit 103 does not perform power control ("None" in power control 705).

A state 701 indicates the case where the detected Vds is greater than 0 V, and it is a state where the setting value is smaller than the optimal value. This state is defined as "state 2" in the present embodiment. In the case of state 2, efficiency is low compared to state 1 due to the influence of switching loss and the like. In the case of state 2, the determination unit 103 performs processing for increasing the setting value by increasing the Vdd (power control 705 is "increase Vdd").

A state 702 indicates the case where the detected Vds is less than 0 V, and it is a state where the setting value is greater than the optimal value. This state is defined as "state 3" in the present embodiment. In the case of state 3 as well, efficiency is low compared to state 1 due to the influence of switching loss and the like. In the case of state 3, the determination unit 103 performs processing for reducing the setting value by reducing the Vdd (power control 705 is "reduce Vdd").

Figure 5:
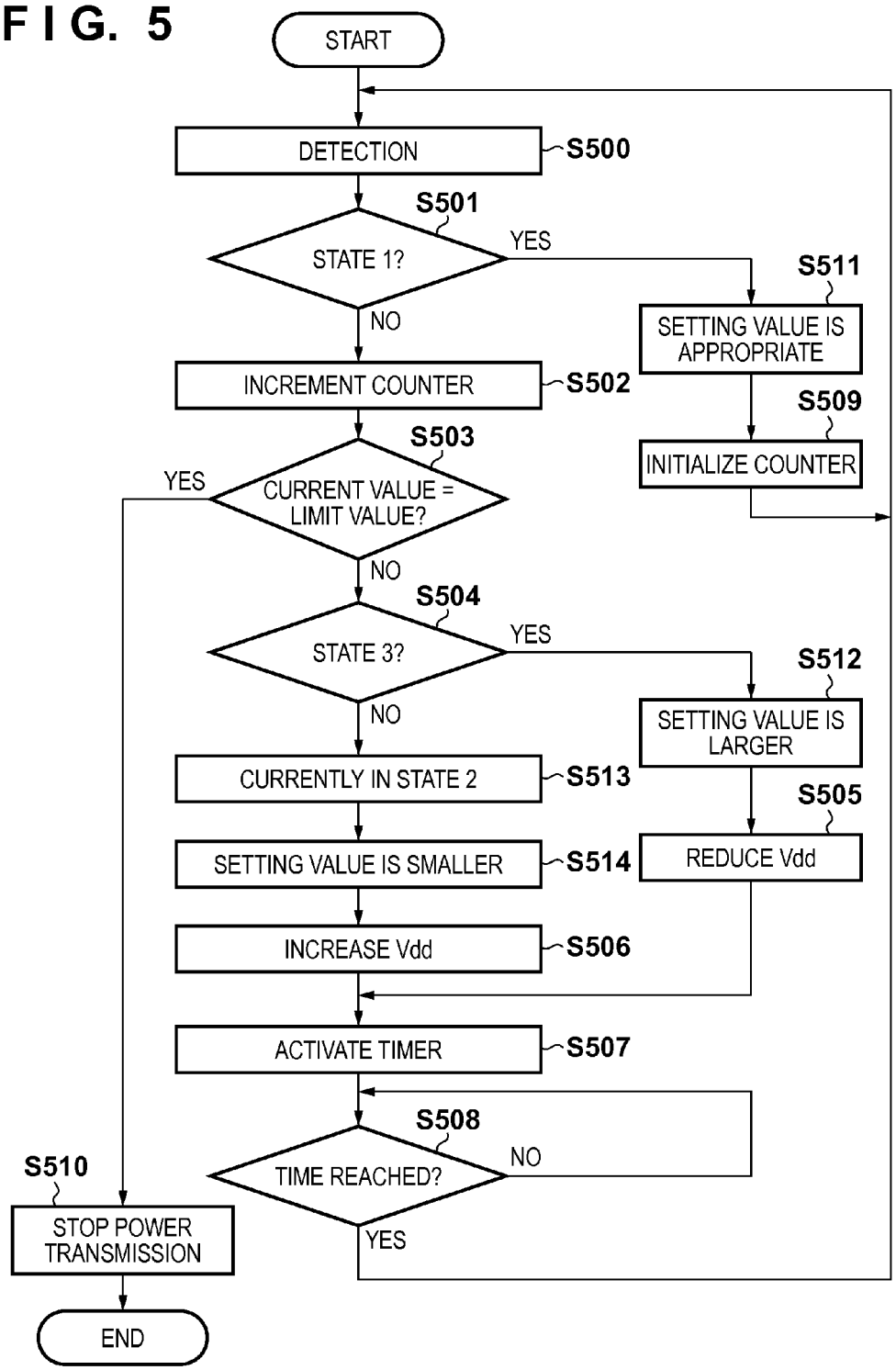
FIG. 5 is a flowchart showing an operation of a power transmitting apparatus according to the first embodiment.

An operation of the power transmitting apparatus 100 according to the present embodiment will be described next with reference to FIG. 5. FIG. 5 is a flowchart showing an operation of the power transmitting apparatus according to the present embodiment. Note that the limit value of the counter is set to "5". A case where the Pout decreases will be described first. First, the state of the power transmission system is the state indicated by the state 306a in FIG. 3A. That is to say, the Pout (302a) is 10 W and the class E amplifier 106 is in the zero voltage switching state. At this time, the Vdd (300a) is 17 V, the class E amplifier setting value (301a) is 11.8 V, efficiency (303a) is 85%, and the Pout (302a) is 10 W. Also, 10 V (Vout, 304a) are supplied to the load 114 via the constant voltage circuit 113. Since state 306a is the zero voltage switching state, the optimal value (305a) is the value 11.8 W, which is obtained by dividing 10 W, which is the Pout (302a), by 85%, which is the efficiency (303a), and the value is equal to 11.8 W, which is the setting value (301a).

In this state, the processing is started in FIG. 5, and the detection unit 102 detects the Vds at time T1 in FIG. 4 (step S500). The Vds waveform at this time is indicated by the double-dotted chain line 401 in FIG. 4. At this time, the present state is a of zero voltage switching state, and the detection result of the detection unit 102 is Vds=0 V. Next, the determination unit 103 references the determination table 116 in FIG. 7 and determines whether or not the present state is state 1 (step S501). Since the detection result of the detection unit 102 was Vds=0 V, the determination unit 103 determines that the present state is state 1 ("Yes" in step S501). Accordingly, the determination unit 103 does not perform control of the power control unit 101 (step S511). Then, the determination unit 103 initializes the present value of the counter 105 to 0 (step S509), and the procedure returns to the processing of step S500.

Here, it is assumed that the Pout has decreased to 1 W. The state of the power transmission system at this time is the state indicated by the state 307a in FIG. 3A, and the Pout (302a) has decreased to 1 W. Also, the Vdd (300a) is 17 V, and therefore there is no change from the Vdd (300a) at the time of state 306a. Since the Vdd does not change, the setting value (301a) that is determined according to the magnitude of the Vdd also does not change and is 11.8 W. As described above, the optimal value (305a) is a value obtained by dividing Pout (1 W in 302a) by 85%, which is the efficiency (303a) in the zero voltage switching state (state 306a). Accordingly, the optimal value (305a) of the state 307a is 1.2 W, which is obtained by dividing 1 W by 85%. The setting value (301a) is 11.8 W, which is greater than and not equal to the optimal value 1.2 W. Accordingly, the efficiency (303a) decreases to 36% due to the influence of switching loss and the like. Here, in order to improve the efficiency, it is necessary to perform processing for reducing the setting value (301a) and making it equal to the optimal value (305a).

Returning to FIG. 5, the detection unit 102 once again detects the Vds (step S500). The state at this time is the state indicated by the state 307a in FIG. 3A, and the Vds waveform is indicated by the dotted line 402 in FIG. 4. With the dotted line 402, Vds reaches 0 V at time T2, which precedes time T1. In such a case, current flows to a parasitic diode (not shown) between the drain 202 and the source 203 in the FET 200 at time T1, and the Vds is −1 V, which substantially matches the forward voltage of the parasitic diode. Accordingly, the Vds detection result detected by the detection unit 102 is Vds=−1 V.

Next, the determination unit references the determination table 116 and determines whether or not the present state is state 1 (step S501). Since the detection result of the detection unit 102 was Vds=−1 V, the determination unit 103 determines that the present state is not state 1 ("No" in step S501). Then, after the present value of the counter 105 is incremented by 1 (step S502), the present value and the limit value are compared (S503). The present value is "1", which is smaller than the limit value "5" ("No" in step S503). Next, the determination unit 103 references the determination table 116 and determines whether or not the present state is state 3 (step S504). Since the detection result of the detection unit 102 was Vds=−1 V, the determination unit 103 determines that the present state is state 3 ("Yes" in step S504). Then, the determination unit 103 references the power control 705 for state 3 in the determination table in FIG. 7, selects "reduce Vdd" as the operation of the power control unit 101, and instructs the power control unit 101. After receiving the instruction from the determination unit 103, the power control unit 101 reduces the Vdd (step S505), thereby lowering the setting value for the class E amplifier 106.

After the power control unit 101 performs the power control in step S505, the determination unit 103 activates the timer 104 (step S507). This is to prevent the detection unit 102 from operating until the outputs from the class E amplifier 106 and the constant voltage circuit 113 are stable.

The timer 104 measures a certain predetermined period of time, and when the time is reached ("Yes" in step S508), the procedure returns to the processing of step S500.

Here, the Vdd has decreased to 9 V due to the control performed by the power control unit 101, and the setting value is 3.5 W. The state of the power transmission system at this time is the state indicated by the state 308a in FIG. 3A. In this state, the setting value (301a), which is 3.5 W, is greater than the optimal value, which is 1.2 W, but the difference between setting value (301a) and the optimal value (305a) is smaller than that in the case of the state 307a. Accordingly, the efficiency (303a) has improved from 36% in the case of state 307a, to 64%. The Vds waveform at this time is indicated by the broken line 403 in FIG. 4. According to the broken line 403, the Vds reaches 0 V at time T2, which precedes time T1, and the Vds at time T1 is −1 V, similarly to the case of the state 307a. Accordingly, based on the previously-described processing from step S501 to step S508, the determination unit 103 and the power transmitting unit 101 control the Vdd in the direction of further lowering the setting value for the class E amplifier 106. That is to say, the power control unit 101 lowers the setting value for the class E amplifier by reducing the Vdd (step S505). After the processing of step S507 and step S508 ends, the procedure returns to the processing of step S500.

Here, the Vdd (300a) has been furthermore lowered to 5 V, and the setting value (301a) is 1.2 W. The state of the power transmission system at this time is the state indicated by the state 309a in FIG. 3A. In this state, the setting value (301a), which is 1.2 W, is equal to the value obtained by dividing the Pout (302a), which is 1 W, by the efficiency (303a) in the state of zero voltage switching (state 306a), which is 85%. In other words, the state 309a is a zero voltage switching state, and the efficiency (303a) has also improved to 85%. The Vds waveform at this time is indicated by the solid line 404 in FIG. 4. With the solid line 404, it is clear that at time T1, the present state is the state of zero voltage switching. Accordingly, returning to FIG. 5, the detection unit detects the Vds at time T1 in FIG. 4 as Vds=0 (step S500), the determination unit 103 determines that the state is state 1 ("Yes" in step S501), and after the processing of steps S511 and S509, the procedure returns to the processing of step S500.

The case where the Pout increases will be described next. The state of the power transmission system has transitioned from state 306b in FIG. 3B, which is a zero voltage switching state, to the state 307b. In other words, the Pout (302b) has increased from 10 W to 18 W. At this time, the Vdd (300b) is 17 V and has not changed. Since the Vdd does not change, the setting value (301b) that is determined according to the magnitude of the Vdd also does not change and is 11.8 W. The optimal value (305b) is 21.2 W, which is a value obtained by dividing the Pout (302b), which is 18 W, by the efficiency (303b) at the time of zero voltage switching (state 306b), which is 85%. The setting value (301b), which is 11.8 W, is less than and not equal to the optimal value (305b), which is 21.2 W. Accordingly, the efficiency (303b) is reduced to 80%. Here, in order to improve the efficiency, it is necessary to perform processing for raising the setting value (301b) and making it equal to the optimal value (305b).

Returning to FIG. 5, the detection unit 102 detects the Vds (step S500). The Vds waveform at this time is indicated by the dotted line 601 in FIG. 6. According to the dotted line 601, the Vds at time T1 is 30V. Accordingly, the Vds detection result detected by the detection unit 102 is Vds=30 V. Since the detection result of the detection unit 102 was Vds=30 V, the determination unit 103 references the determination table 116 and determines that the present state is not state 1 ("No" in step S501). Furthermore, the counter is incremented (step S502), and if the present value of the counter is lower than the optimal value ("No" in step S503), the determination unit 103 references the determination table 116 and determines whether or not the present state is state 3. The determination unit 103 determines that the present state is not state 3 ("No" in step S504), and determines that it is state 2 (step S513). Then, the determination unit 103 references the power control 705 for state 2 in the determination table in FIG. 7, selects "increase Vdd" as the operation of the power control unit 101, and instructs the power control unit 101. After receiving the instruction from the determination unit 103, the power control unit 101 increases the Vdd (step S506), thereby raising the setting value for the class E amplifier 106.

Here, the power control unit 101 has raised the Vdd to 23 V. The state of the power transmission system at this time is the state indicated by the state 308b in FIG. 3B. At this time, the setting value 301b has been raised to 21.2 W. The setting value (301b) at this time is equal to a value obtained by dividing the Pout (302b), which is 18 W, by the efficiency (303b) in the state of zero voltage switching (state 306b), which is 85%. In other words, the state 308b is the state of zero voltage switching, and the efficiency (303b) has also improved to 85%. The Vds waveform at this time is indicated by the solid line 602 in FIG. 6. With the solid line 602, at time T1, the present state is the state of zero voltage switching.

Note that in the present embodiment, in the case of comparing the present value and the limit value after the counter has been incremented (step S502), if both values are equal ("Yes" in step S503), the determination unit 103 determines that the efficiency will not converge and stops power transmission (step S510). Examples of factors preventing the convergence of the efficiency are the case where, due to malfunction in the power transmitting apparatus 100 or the power receiving apparatus 109, load variation exceeds the range in which the power control unit 101 can perform control, and the like. By stopping the power transmission using this kind of processing, it is possible to ensure safety in the power transmission system.

Also, the timer 104 is provided in the present embodiment, and after the outputs from the class E amplifier 106 and the constant voltage circuit 113 stabilize, or in other words, after a certain amount of time elapses, the detection unit 102 and the determination unit 103 are allowed to operate (step S507, step S508). According to this kind of processing, the power control unit 101 can be prevented from controlling the Vdd (steps S505 and S506) based on the result of the detection unit 102 detecting the Vds (step S500) in a transitional state where the output is not stable.

As described above, the detection unit 102 detects the Vds at time T1, and based on the detection result, the determination unit 103 determines the present state (any of states 1 to 3) from the determination table. Then, the determination unit 103 furthermore references the determination table and controls the power control unit 101 in order to increase or reduce the setting value for the class E amplifier 106. Accordingly, it is possible to cause the efficiency that had decreased when the power consumption of the load 114 decreased to converge to the efficiency at the time of zero voltage switching (high efficiency).

Modified Example 1

In the above description, the detection unit 102 is configured to detect the voltage value of the Vds at time T1 in order to determine the state of the power transmission system (any of states 1 to 3), but the present invention is not limited to this. That is to say that a configuration is possible where the local maximum value of the Vds waveform when the FET 200 is in the off state is detected. Specifically, the detection unit 102 detects the local maximum point of the Vds prior to time T1 (not including time T1) starting from time T0 in FIG. 4, and the determination unit 103 determines the state based on that detection result. A method for determining the state using the detected local maximum value will be described below with reference to FIGS. 8 to 12B.

Figures 8, 9A, 9B:
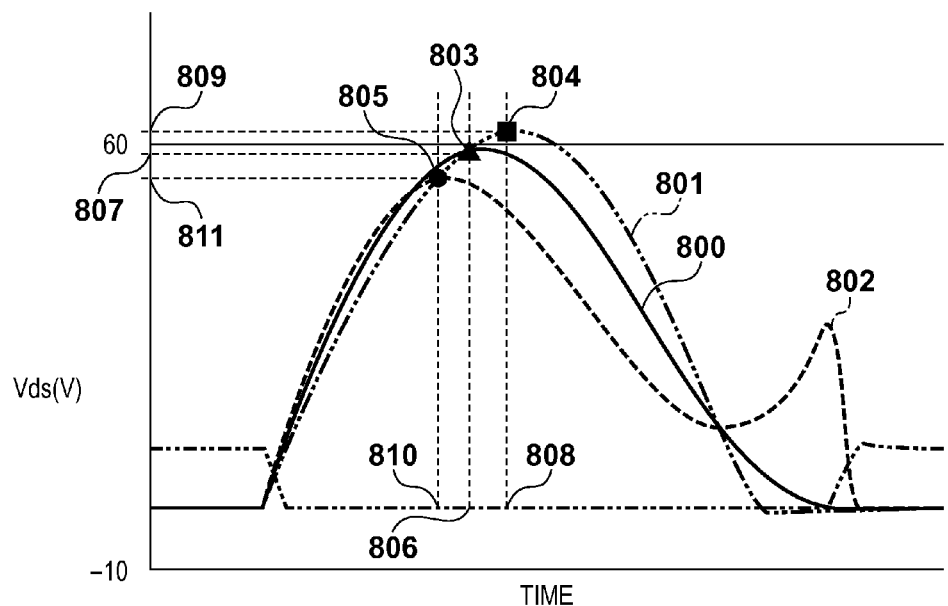
FIG. 8 is a diagram showing the local maximum points of the Vds waveforms.
FIG. 9A is a diagram showing a local maximum point detection result of the Vds waveforms.
FIG. 9B is a diagram showing a determination table in the case where the detection unit has detected the local maximum points.

FIG. 8 is a diagram showing the Vds waveforms and their local maximum points in states 1 to 3. The solid line 800 indicates the case of the zero voltage switching state (state 1). Also, the double-dotted chain line 801 indicates the case of the state where the optimal value (305a, 305b) is smaller than the setting value (301a, 301b) of the class E amplifier 106 (state 3), and the solid line 802 indicates the case of the state where, conversely, the optimal value is greater than the setting value of the class E amplifier 106 (state 2). A triangle mark 803 indicates the local maximum point of the Vds waveform during state 1, a square mark 804 indicates the local maximum point of the Vds waveform during state 3, and a circle mark 805 indicates the local maximum point of the Vds waveform during state 2. Time 806 indicates the time corresponding to the triangle mark 803, and voltage 807 indicates the voltage value of the Vds corresponding to the triangle mark 803. Time 808 indicates the time corresponding to the square mark 804, and voltage 809 indicates the voltage value of the Vds corresponding to the square mark 804. Time 810 indicates the time corresponding to the circle mark 805, and voltage 811 indicates the voltage value of the Vds corresponding to the circle mark 805. In this modified example, in the processing of step S500 in FIG. 5, the detection unit 102 detects the differences between the voltage value and time of the Vds at the local maximum point of the Vds waveform and the voltage value and time of the Vds at the local maximum point (triangle mark 803) in the case of the zero voltage switching state (state 1), which is used as a reference.

FIG. 9A shows the detection results for the local maximum value of the Vds. Result 903 is the detection result for the local maximum point in state 1 (triangle mark 803). Since the triangle mark 803 is the reference when detecting the Vds and the time at the local maximum point in state 2 and state 3, Vds 900 and time 901 are both zero. Result 902 is the detection result for the local maximum point in state 3 (square mark 804). According to result 902, the Vds (809) at the square mark 804 is 5 V higher than the Vds (807) at the triangle mark 803 (Vds (900)=5 V), and the time (808) at the square mark 804 is 0.5 µs later than the time (806) at the triangle mark 803 (time (1101)=0.5 µs). The signs for the Vds 900 and the time 901 are both positive. Result 904 is the detection result for the local maximum point in state 2 (circle mark 805). According to result 904, the Vds (811) at the circle mark 805 is 5 V lower than the Vds (807) at the triangle mark 803 (Vds (900)=−5 V), and the time (810) at the circle mark 805 is 0.5 µs earlier than the time (806) at the triangle mark 803 (time (901)=−0.5 µs). The signs for the Vds 900 and the time 901 are both negative.

FIG. 9B shows the determination table 116 referenced by the determination unit 103 in the processing of steps S501 and S504 in FIG. 5 when the detection unit 102 obtains the detection results shown in FIG. 9A. In FIG. 9B, state 911 indicates the case where the signs for the Vds and the time are both positive, and the determination unit 103 determines that the present state is state 3. In this case, the power control unit 101 reduces the Vdd according to an instruction from the determination unit 103. Also, the state 910 indicates the case where the signs of the Vds and the time are both negative, and the determination unit 103 determines that the present state is state 2. In this case, the power control unit 101 increases the Vdd according to an instruction from the determination unit 103.

Thus, an effect that is the same as that of the above-described embodiment can be obtained also in the case where the detection unit 102 is configured to detect the local maximum value of the Vds waveform in a state where the FET 200 is off and the determination unit 103 controls the power control unit 101 based on the detection result. Also, according to FIG. 9B, since the signs for the Vds 905 and the time 906 match in the states 910 and 911, a configuration is possible where the detection unit 102 detects one of the Vds 900 and the time 901 in FIG. 9A.

Modified Example 2

Figures 10, 11:
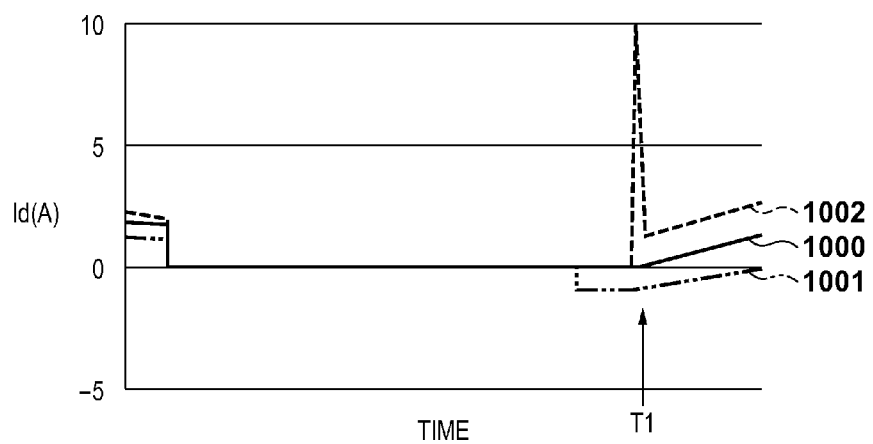
FIG. 10 is a diagram showing drain waveforms.
FIG. 11 is a diagram showing a determination table in the case where the detection unit has detected Ids.

As another modified example, a configuration is possible where the detection unit 102 detects a drain current (hereinafter referred to as "Id") flowing from the drain 202 to the source 203 at time T1. A method for determining the state using the detected Id will be described below with reference to FIGS. 10 to 11. FIG. 10 is a diagram showing Id waveforms. Waveform 1000 indicates the Id waveform in state 1 and is 0 A at time T1. Waveform 1001 indicates the Id waveform in state 3 that is approximately −1 A at time T1 and the Id is less than 0. Waveform 1002 indicates the Id waveform in state 2 that is approximately 10 A at time T1 and the Id is greater than 0.

FIG. 11 shows the determination table 116 that is referenced in the processing of steps S501 and S504 in FIG. 5 by the determination unit 103 in the case where the detection unit 102 has detected the Id. In FIG. 11, state 1101 indicates the case where the Id (1103) is greater than 0 A, and the determination unit 103 determines that the present state is state 2. In this case, the power control unit 101 increases the Vdd according to an instruction from the determination unit 103 (step S506). Also, the state 1102 indicates the case where the Id (1103) is less than 0 A, and the determination unit 103 determines that the present state is state 3 ("Yes" in step S504). In this case, the power control unit 101 reduces the Vdd according to an instruction from the determination unit 103 (step S505). The state 1100 indicates the case where the Id 1103 is 0 A, and the determination unit 103 determines that the setting value is appropriate ("Yes" in step S501, step S511). In this case, the determination unit 103 does not instruct power control to the power control unit 101.

Thus, an effect similar to that of the above-described embodiment can be obtained also in the case where the detection unit 102 detects the Id at time T1 and the determination unit 103 controls the power control unit 101 based on that detection result.

Modified Example 3

Figure 12A:
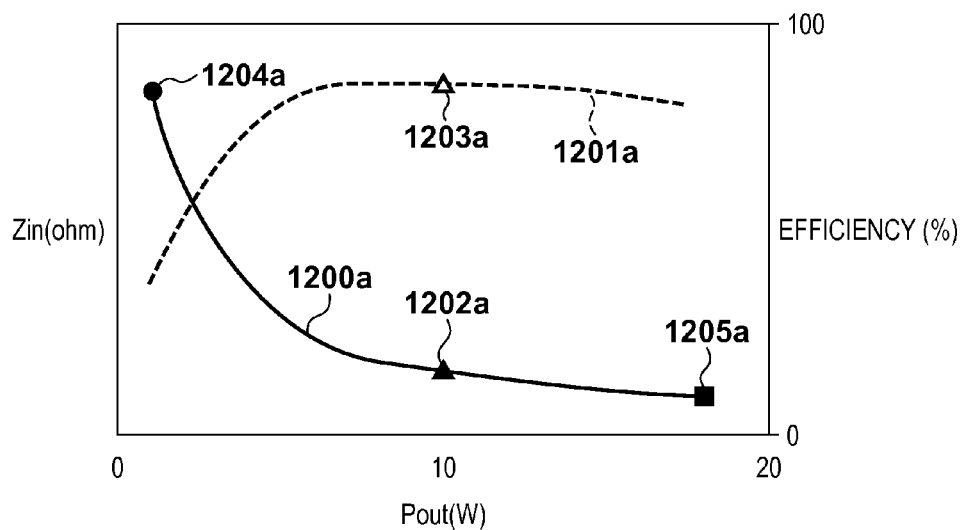
FIG. 12A is a diagram showing Zin and efficiency with respect to Pout before power control.

Also, as another modified example, a configuration is possible where the detection unit 102 detects the voltage value and the current value of the Vdd 204 and calculates the input impedance (hereinafter referred to as "Zin") of the class E amplifier 106 based on those results. A method for determining the state using the detected Zin will be described below with reference to FIGS. 12 to 13. FIG. 12A shows the relationship between the changes in the Pout, the Zin, and the efficiency. A solid line 1200a in FIG. 12A represents the Zin. A black triangle mark 1202a is the Zin during state 1 when the Pout is 10 W (state 306a in FIG. 3), and in this case, the Zin is 23 ohms. According to a solid line 1200a, if the Pout decreases in comparison to the Zin during state 1 (triangle mark 1202a) and state 3 is entered (e.g., state 307a in FIG. 3A), the Zin increases. On the other hand, if the Pout increases and state 2 is entered (e.g., state 307b in FIG. 3B), the Zin decreases.

Also, a broken line 1201a in FIG. 12A represents the efficiency and a white-filled triangle mark 1203a is the efficiency during state 1 where the Pout is 10 W, and according to the state 306a in FIG. 3A, the efficiency is 85%. According to the broken line 1201a, it is clear that the efficiency peaks at the white-filled triangle mark 1203a and decreases in the case where the Pout decreases and in the case where the Pout increases as well. That is to say, upon entering state 2 or state 3 from state 1, the efficiency decreases. Thus, as can be understood based on the solid line 1200a and the broken line 1201a, the class E amplifier 106 has a feature where a Zin for realizing high efficiency is determined uniquely.

FIG. 13 shows a determination table that is referenced in the processing of steps S501 and S504 in FIG. 6 by the determination unit 103 when the detection unit 102 has detected the Zin. In FIG. 13, the state 1301 indicates the case where the Zin (1303) is less than 23 ohms, and the determination unit 103 determines that the present state is state 2. In this case, the power control unit 101 increases the Vdd according to an instruction from the determination unit 103 (step S506). Also, the state 1302 indicates the case where the Zin 1303 is greater than 23 ohms and the determination unit 103 determines that the present state is state 3 ("YES" in step S504). In this case, the power control unit 101 reduces the Vdd according to an instruction from the determination unit 103 (step S505). Also, the state 1300 indicates the case where the Zin 1303 is 23 ohms and the determination unit 103 determines that the setting value is appropriate ("YES" in step S501, step S511). In this case, the determination unit 103 does not instruct power control to the power control unit 101.

Figure 12B:
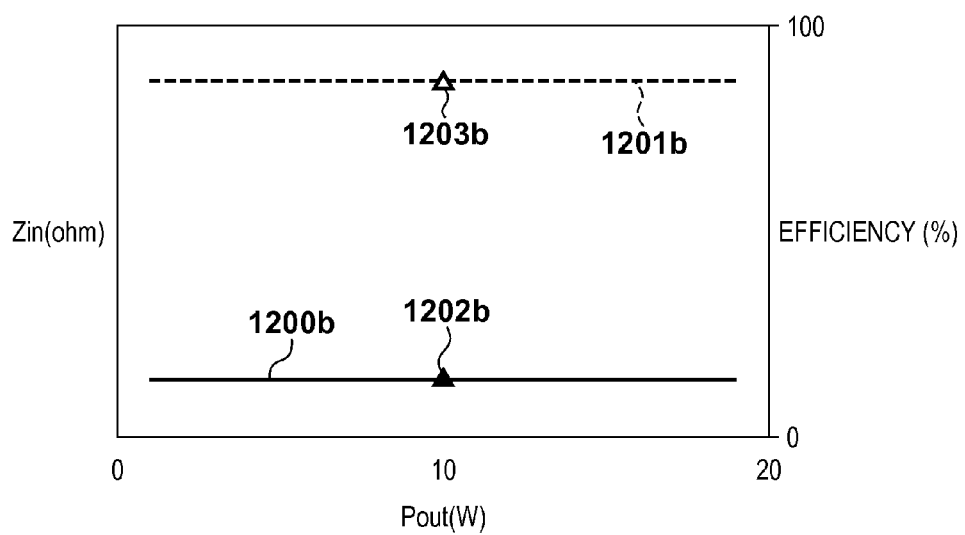
FIG. 12B is a diagram showing Zin and efficiency with respect to Pout after power control.

FIG. 12B shows the relationship between the changes in the Pout, the Zin, and the efficiency in the case where the power control unit 101 has performed the operation based on the determination table in FIG. 13. A solid line 1200b in FIG. 12B represents the Zin. The triangle mark 1202b is the Zin during state 1 when the Pout is 10 W (state 306a in FIG. 3A), and in this case, the Zin is 23 ohms. According to the solid line 1200b, the Zin does not change even if the Pout increases. Also, a broken line 1201b in FIG. 12B represents the efficiency and a white-filled triangle mark 1203b is the efficiency during state 1 where the Pout is 10 W, and according to the state 306a in FIG. 3A, the efficiency is 85%. According to the broken line 1201b, the efficiency is equal to the value of the white-filled triangle mark 1203b, even if the Pout increases. That is to say, even if state 2 or state 3 is entered from state 1, the efficiency does not change.

Thus, an effect similar to that of the above-described embodiment is achieved also in the case where the detection unit 102 detects the Zin, the determination unit 103 determines the system state based on the detection result and controls the power control unit 101 according to that state. This configuration is applicable not only to the class E amplifier, but also to a power transmitting apparatus in which the Zin for realizing high efficiency is determined uniquely.

Modified Example 4

Also, as another modified example, a configuration is possible where the determination unit 103 determines the value of the Vdd 204 based on the detection result of the detection unit 102. A method for determining the value of the Vdd 204 based on the detection result of the detection unit 102 will be described below with reference to FIG. 14. FIG. 14 shows an example of the determination table 116 that can be applied to this modified example. For each state, FIG. 14 shows a Zin 1403, which is the detection result of the detection unit 102, a Pout 1404, a setting value 1405, and a Vdd 1406 for the class E amplifier 106 to output power for the setting value 1405. A state 1400 indicates the case where the Pout is 1 W (state 307a in FIG. 3A). At this time, the Zin 1403 is 134 ohms and corresponds to the circle mark 1204a in FIG. 12A. The determination unit 103 references the Vdd 1406, determines that 5 V are to be applied to the Vdd 204, and according to an instruction based on that determination, the power control unit 101 applies the 5 V to the Vdd 204. In this case, the system state is the state 309a and the class E amplifier 106 is in the zero voltage switching state.

A state 1402 indicates the case where the Pout is 18 W (state 307b in FIG. 3B). At this time, the Zin 1403 is 13 ohms and corresponds to the square mark 1205a. The determination unit 103 references the Vdd 1406, determines that 23 V are to be applied to the Vdd 204, and according to an instruction based on that determination, the power control unit 101 applies the 23 V to the Vdd 204. In this case, the system state is the state 308b and the class E amplifier 106 is in the zero voltage switching state. Thus, an effect that is similar to that of the above-described embodiment is achieved also when the detection unit 102 is configured to detect the input impedance of the class E amplifier 106 and the determination unit 103 is configured to determine the value of Vdd 204 based on the detection result. Furthermore, by storing the Zin of the class E amplifier 106 and the applied Vdd in association with each other in the determination table 116, it is possible to cause the efficiency to converge to the efficiency at the time of zero voltage switching (high efficiency) at an earlier time. Note that in this modified example, the Vdd is stored in association with the Zin in the determination table 116, but the Vdd may be stored in association with another detection result.

Note that in the embodiment above, a voltage resonance amplifier that causes the Vds to resonate was described as an example, but a configuration is possible using a current resonance amplifier that realizes zero current switching by causing the Id to resonate. In that case, the detection unit 102 is configured to detect the Id. Also, in the embodiment, a configuration is used where the output from the class E amplifier is set by controlling the DC voltage Vdd 204, but this may be a configuration where the output is set by controlling the duty ratio when the FET 200 is on or off, and for example, output setting using PWM control may be used. Also, the operations of the detection unit 102 and the determination unit 103 are put on standby by the timer 104, but a similar effect can be obtained also with a means by which the power receiving apparatus 109 notifies the power transmitting apparatus 100 that the output value of the constant voltage circuit 113 is stable.

Second Embodiment

Figure 15:
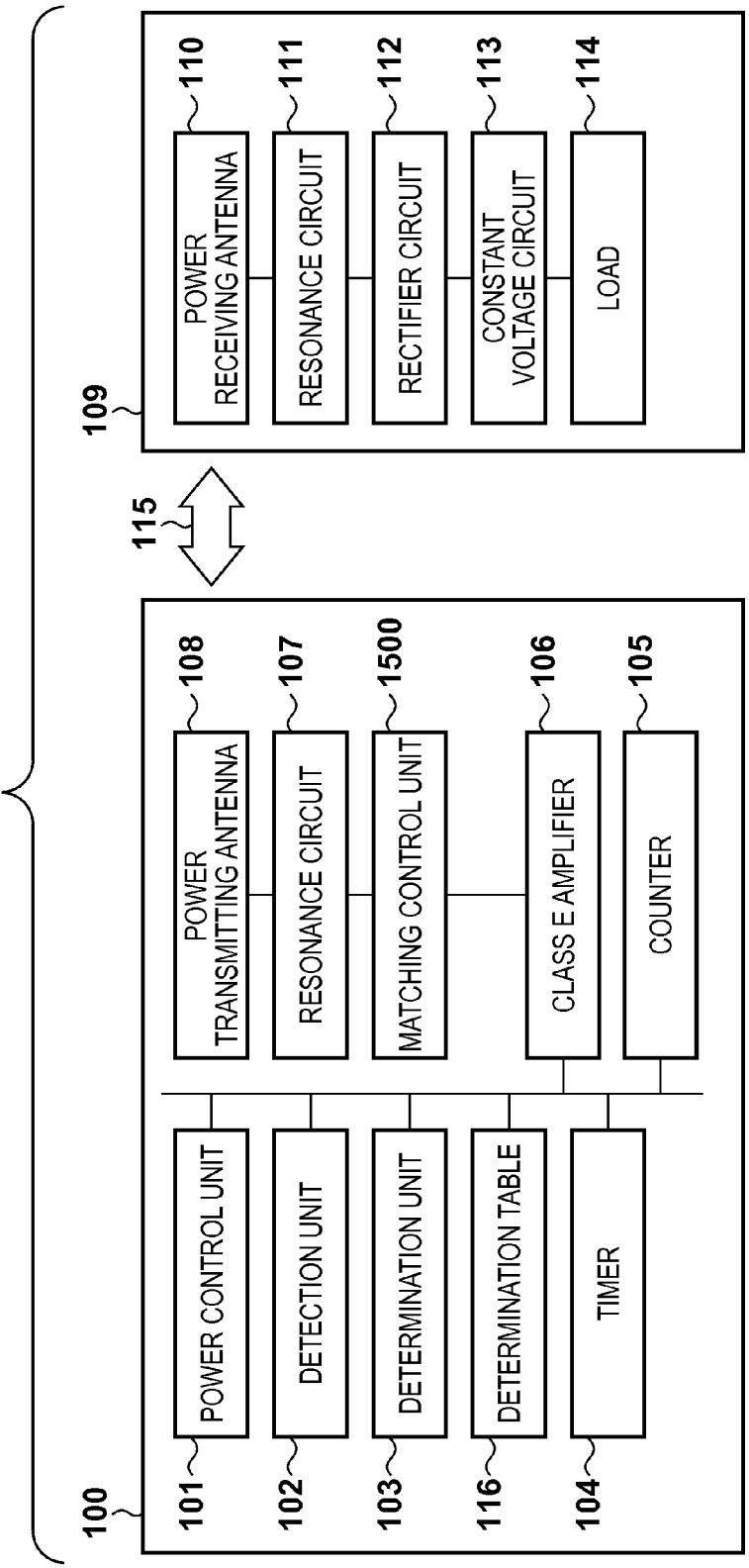
FIG. 15 is a diagram showing the configuration of a power transmission system according to the first embodiment.

In the present embodiment, control of the power transmitting apparatus in the case where load variation and gap variation can occur at the same time will be described. If gap variation occurs, the impedance when the transmission path 115 is seen from the resonance circuit 107 shifts, and therefore reflected waves are generated between the resonance circuit 107 and the class E amplifier 106, and the efficiency decreases. FIG. 15 is a diagram showing the configuration of the power transmission system according to the present embodiment. In comparison with FIG. 1, a matching control unit 1500 has been added. The matching control unit 1500 performs a task of impedance matching (referred to below as "matching") between the resonance circuit 107 and the class E amplifier 106 in order to suppress reflected waves.

Figure 17:
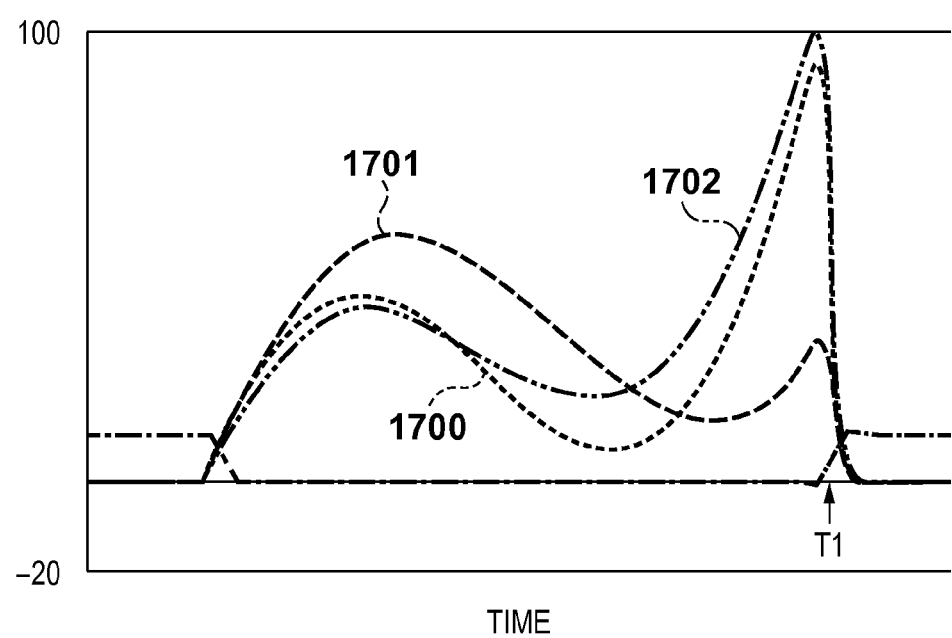
FIG. 17 is a diagram showing the Vds waveforms in the case where load variation and gap variation occur.
Figure 18:
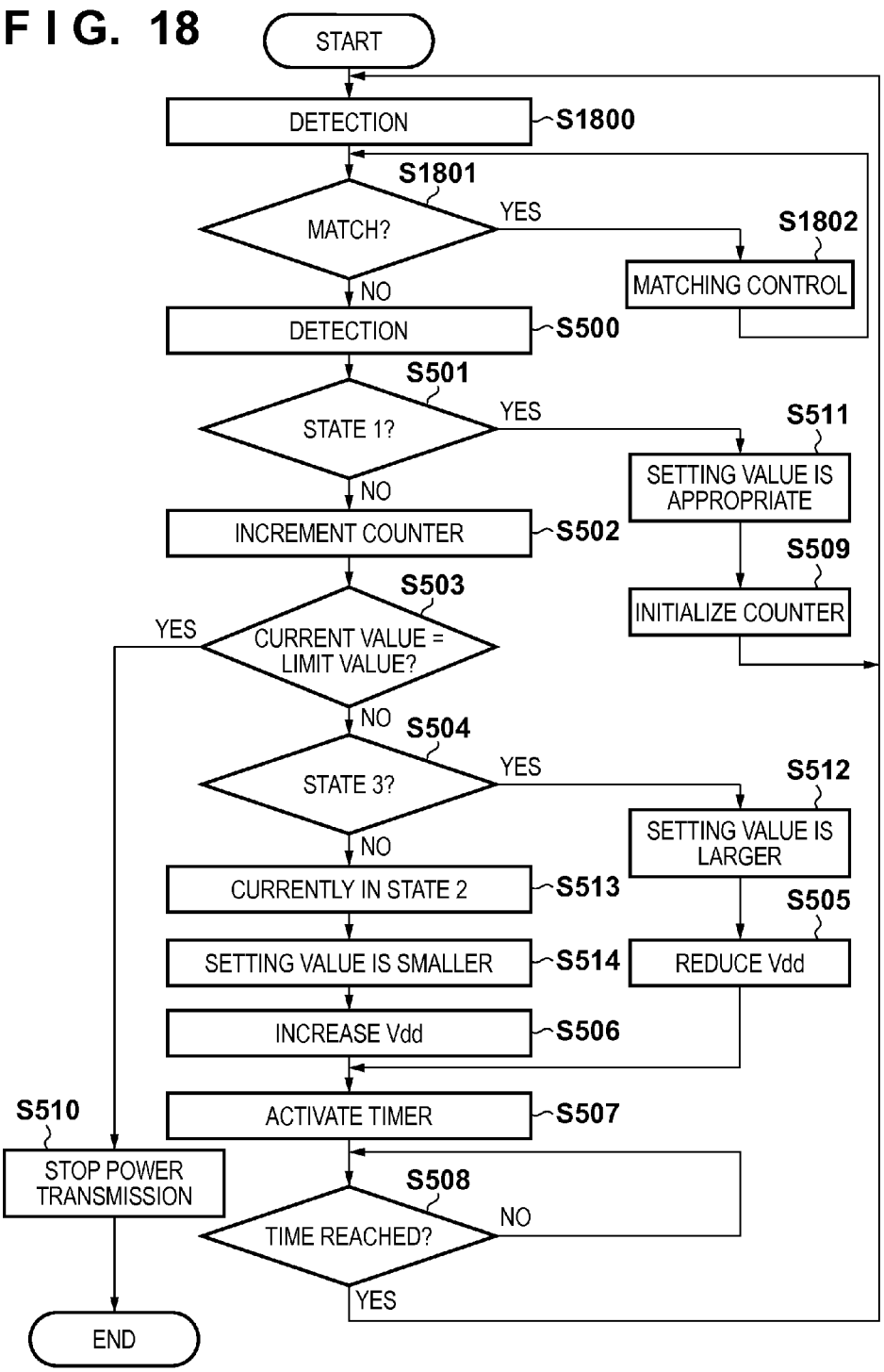
FIG. 18 is a flowchart showing an operation of the power transmitting apparatus according to the second embodiment.

FIG. 16 is a table showing states of the power transmission system according to the present embodiment in the case where the power consumption of the load 114 changes. A gap 1605 is the distance between the power transmitting apparatus 100 and the power receiving apparatus 109 and represents the distance between the power transmitting antenna 108 and the power receiving antenna 110 for example. In FIG. 16, a state 1606 is the same state as the state 306a in FIG. 3A and is a zero voltage switching state. The gap 1605 at this time is 55 mm. FIG. 17 shows the Vds waveforms and the Vgs waveform in the present embodiment. The dotted chain line 400 is the Vgs waveform, similarly to FIG. 4. In FIG. 17, the Vds waveform during a state 1607 in FIG. 15 is a dotted line 1700, the Vds waveform during a state 1608 is a broken line 1701, and the Vds waveform during a state 1610 is a double-dotted chain line 1702. Also, FIG. 18 is a flowchart showing an operation of the power transmitting apparatus according to the present embodiment. In comparison to FIG. 5, the processing of steps S1800 to S1802 has been added.

Operations of the power transmitting apparatus according to the present embodiment will be described next with reference to FIG. 18. First, the state transitions from the state 1606 to the state 1607 in FIG. 16, a Pout 1602 increases to 18 W, and the gap 1605 changes to 95 mm. At this time, efficiency 1603 decreases to 44%. The Vds waveform at this time is indicated by the dotted line 1700 in FIG. 17. If load variation, gap variation, or both occur, the class E amplifier 106 will no longer be in the zero voltage switching state. At this time, the detection unit 102 detects the Vds at time T1 (step S1800). According to the dotted line 1700, the Vds is greater than 0 and the class E amplifier 106 is not in the zero voltage switching state at time T1. Accordingly, the determination unit 103 recognizes that load variation, gap variation, or both have occurred.

Next, the determination unit 103 determines whether or not matching has been achieved (step S1801). In state 1607, matching has not been achieved ("NO" in step S2201) since the gap 1605 has changed to 95 mm. Here, a configuration is used where the matching quality is determined according to a configuration in which a scintillator is provided in the matching control unit and the reflected waves are observed. Accordingly, the matching control unit 1500 performs matching control such that matching can be achieved (step S1802). The matching control has a configuration where the matching control unit is constituted by multiple elements (capacitors or inductors) for example, and matching is achieved by switching between the multiple elements, and the like. A state 1608 indicates the system state after the matching control has been carried out. Compared with the state 1607, which is before the matching control has been carried out, the efficiency 1603 of the state 1608 that is after the matching control has been carried out has increased to 80%. The state 1608 is the same as the above-described state 307b with respect to load variation. Also, the broken line 1701 shows the Vds waveform at this time, and the broken line 1701 is the same as the above-described dotted line 601 in FIG. 6 with respect to load variation.

Thus, since the influence of reflected waves caused by gap variation (decrease in efficiency) has been removed, only the influence of load variation is the cause of the decrease in the efficiency. Upon achieving matching ("YES" in step S1801), the determination unit 103 need only deal with load variation, and therefore control for compensating for the decrease in efficiency caused by load variation is performed based on the previously-described flow from step S500 to step S514. A state 1609 shows the post-control system state. The state 1609 is the same as the above-described state 308b with respect to load variation, and the influence of load variation and gap variation that were generated in the state 1607 can be removed and high-efficiency transmission can be realized.

Here, a case will be briefly described in which the power control (steps S505 and S506) is performed prior to the matching control (step S1802). In state 1607, the determination unit 103 has increased the Vdd based on the determination table 116 shown in FIG. 7 since the Vds at time T1 is greater than 0 (dotted line 1700). The state 1610 shows the system state at that time. The efficiency 1603 in the state 1610 is 41%, which is even lower than 44%, which is the efficiency in the state 1607. The Vds waveform at this time is indicated by the double-dotted chain line 1702. It is clear that in comparison to the dotted line 1700, the Vds at time T1 of the double-dotted chain line 1702 is greater, and switching loss has furthermore increased. Thus, if power control is performed before the matching control, the efficiency will furthermore decrease, and therefore the matching control needs to be performed before the power control.

As described above, in the present embodiment, due to having a configuration where matching control (step S2202) is performed prior to power control (i.e., steps S505 and S506 in FIG. 5), it is possible to cause the decreased efficiency caused by both load variation and gap variation to converge to the efficiency at the time of zero voltage switching. Note that in the above-described embodiment, a class E amplifier having a MOFSET was described as an example, but the present embodiment is applicable also in the case where the MOFSET is changed to something else, as long as it is an amplifier having a switching element.

According to the embodiment above, even in the case where load variation or gap variation has occurred, by changing the Vdd appropriately according to the state and setting the setting value to an appropriate value, it is possible to cause the decreased efficiency to converge to the efficiency of the zero voltage switch state (high efficiency).

Third Embodiment

In the present embodiment, the power transmitting apparatus and the power receiving apparatus each have a communication means for communicating with a partner apparatus, and a description will be given for control of the power transmitting apparatus in the case where the power transmitting apparatus receives load variation information for the power receiving apparatus from the power receiving apparatus via the communication means.

Figure 19:
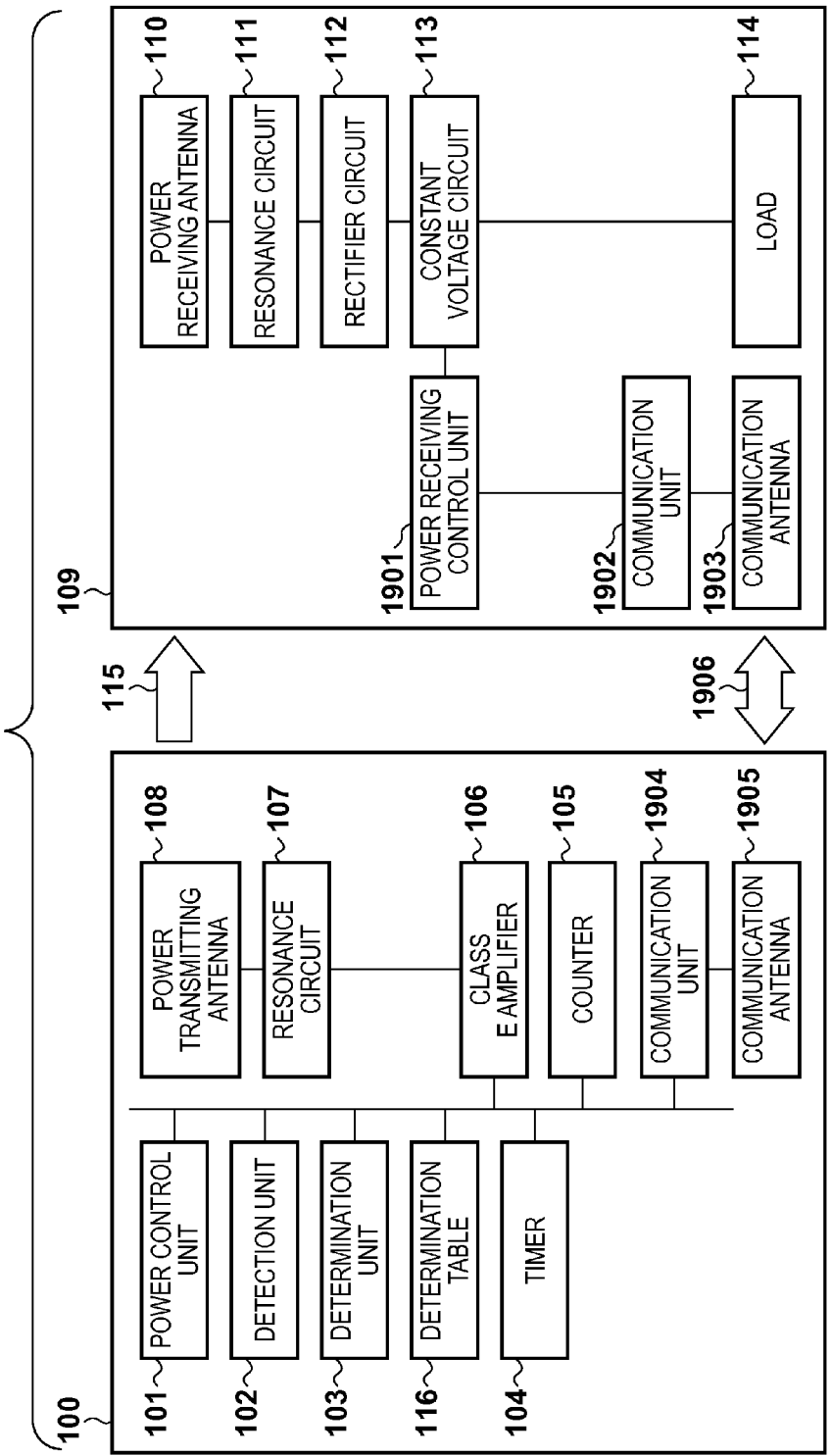
FIG. 19 is a diagram showing the configuration of the power transmission system according to a third embodiment.

FIG. 19 is a diagram showing the configuration of the power transmission system according to the present embodiment. In FIG. 19, elements common to FIG. 1 are denoted by the same reference numerals. Generally, when transmitting power from a power transmitting apparatus to a power receiving apparatus, the power transfer partner needs to be specified with the exchange of IDs or the like to prevent transmitting power to the wrong partner apparatus and receiving power from the wrong apparatus. In order to exchange IDs, communication needs to be performed between the power transmitting apparatus and the power receiving apparatus.

In the power receiving apparatus 109, a power receiving unit 1901 performs power receiving processing, a communication unit 1902 performs ID exchanging and the like, and a communication antenna 1903 is used for the communication of the power receiving apparatus 109. On the other hand, communication with the communication unit 1902 of the power receiving apparatus 109 that is connected by a transmission route 1906 is performed by a communication unit 1904 in the power transmitting apparatus 100 via the communication antenna 1905 and the communication antenna 1903 of the power receiving apparatus 109. The power reception control unit 1901 has a function of performing power reception processing, a function of outputting the ID for initial authentication to the communication unit 1902, a function of, after the initial authentication, connecting the output of the constant voltage circuit 113 to the load 114, a function of calculating the power consumption of the load 114 based on the current output from the constant voltage circuit 113, and the like. In the present embodiment, the power receiving apparatus 109 periodically transmits the power consumption of the load 114 that was calculated by the power reception control unit 1901 from the communication unit 1902 to the power transmitting apparatus 100. The power transmitting apparatus 100 can always monitor the power consumption of the load 114 that is received from the power receiving apparatus 109.

Figure 20:
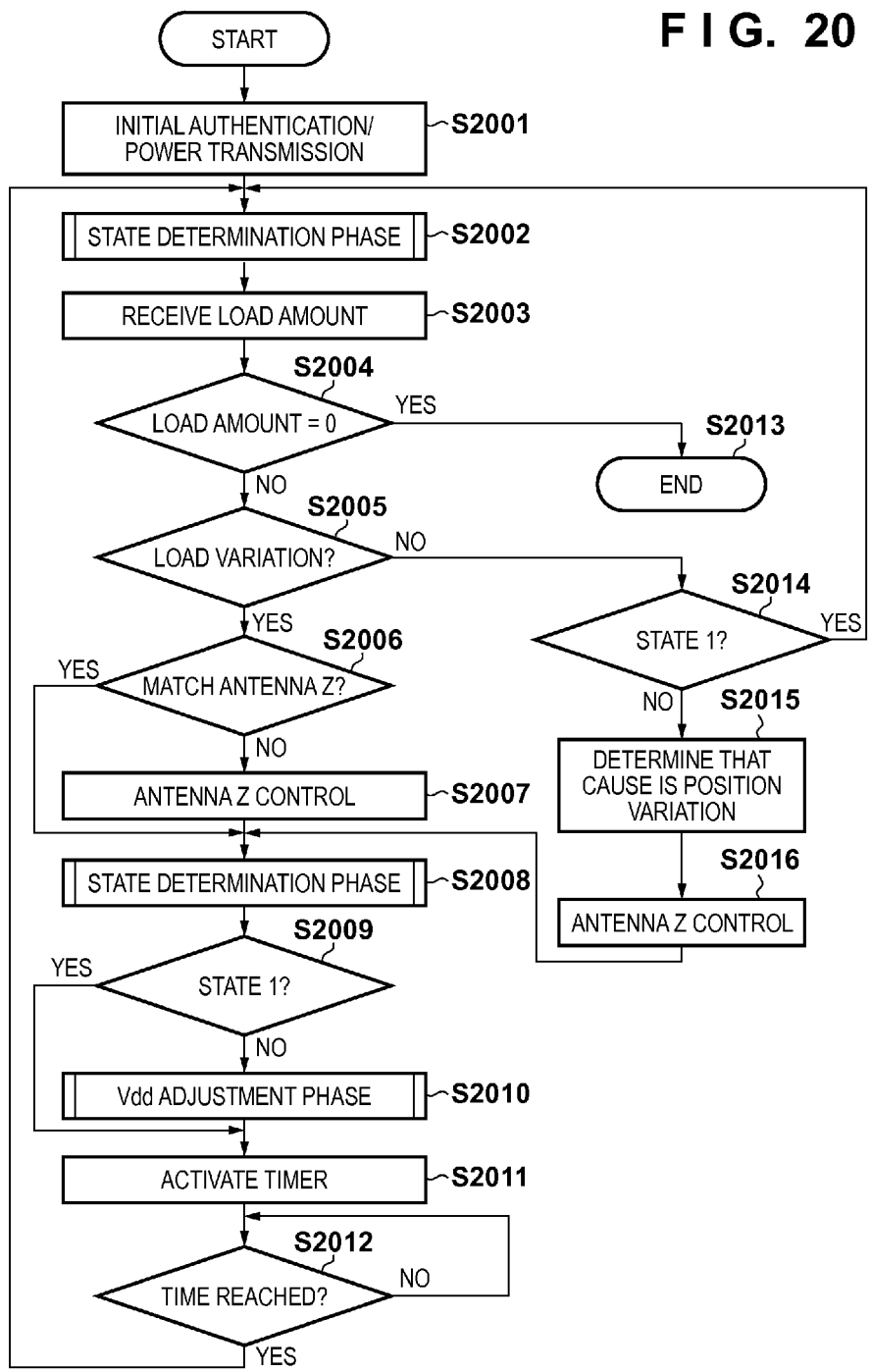
FIG. 20 is a flowchart (1) showing an operation of the power transmitting apparatus according to the third embodiment.
Figure 21:
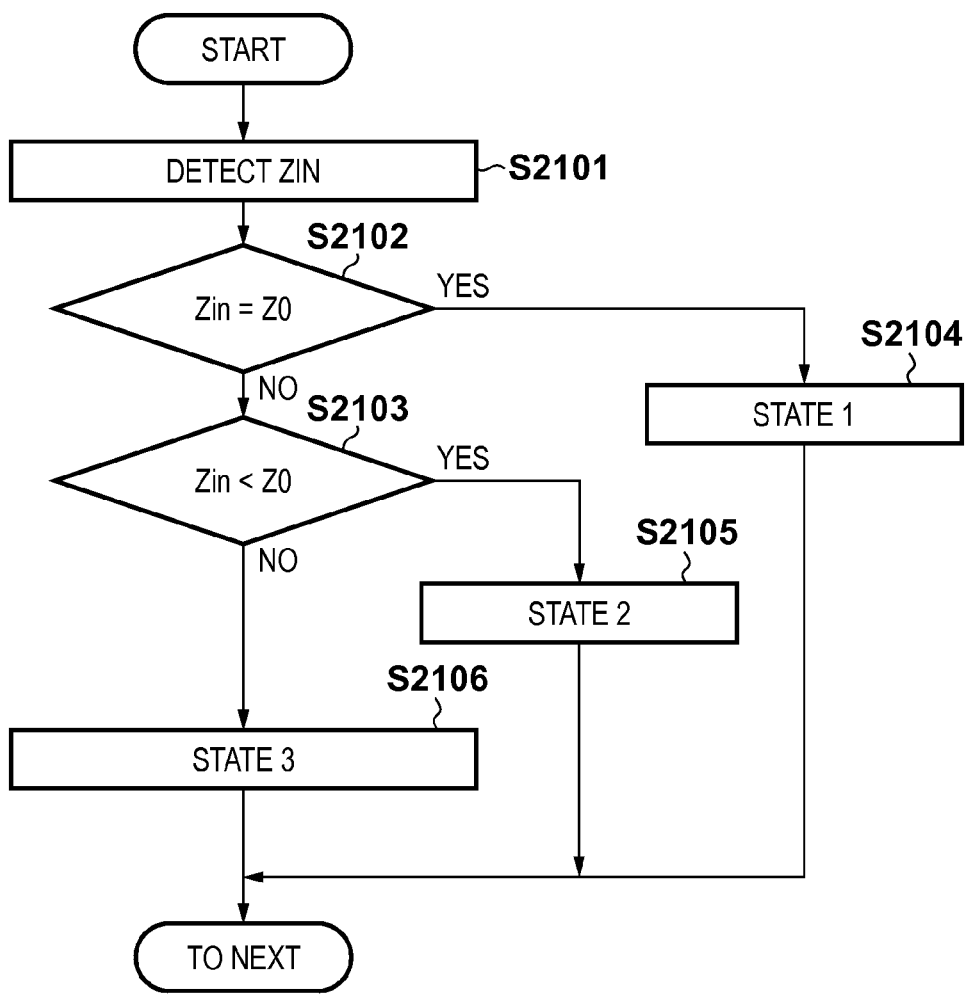
FIG. 21 is a flowchart (2) showing an operation of the power transmitting apparatus according to the third embodiment.

Operations of the power transmitting apparatus 100 according to the present embodiment will be described next with reference to FIGS. 20 to 22. FIGS. 20 to 22 are flowcharts showing operations performed by the power transmitting apparatus according to the present embodiment. In FIG. 20, the power transmitting apparatus 100 first performs the initial authentication with the power receiving apparatus 109 via the communication unit 1904, and then starts power transmission (step S2001). Next, the power transmitting apparatus 100 determines the states 1 to 3 shown in FIG. 13 in the description of Modified Example 2 of the first embodiment in a state determining phase according to the determination unit 103 in step S2002. FIG. 21 shows detailed operations for the state determining phase in step S2002. The detection unit 102 calculates the input impedance Zin based on the drain voltage Vdd and the drain current Id of the class E amplifier 106 (step S2101). If the Zin is equal to the impedance Z0 (23 ohms in FIG. 13) in the initial state ("Yes" in step S2102), the determination unit 103 determines that the present state is state 1 (step S2104). On the other hand, if it is determined that the Zin is not equal to Z0 ("No" in step S2102), and the Zin is less than Z0 ("Yes" in step S2103), the determination unit 103 determines that the present state is state 2 (step S2105). Furthermore, if it is determined that the Zin is greater than Z0 ("No" in step S2103), the determination unit 103 determines that the present state is state 3 (step S2106).

Next, the power transmitting apparatus 100 receives the power consumption of the load 114 (hereinafter referred to as the "load amount") from the power receiving apparatus 109 via the communication unit 1904 (step S2003). If the received load amount is 0, the determination unit 103 determines that the power receiving apparatus 109 does not need to receive power ("Yes" in step S2004), and the power transmitting apparatus 100 ends power transmission (step S2013). In FIG. 20, the power transmitting apparatus 100 ends power transmission when the load amount is 0, but power transmission may be ended due to the power transmitting apparatus 100 receiving a notification of the end of power reception from the power receiving apparatus 109. In the case where the received load amount is 0 ("No" in step S2004) and there is no variation in the load amount ("No" in step S2005), if the state determined in step S2002 is state 1 ("Yes" in step S2014), the determination unit 103 determines that there is no change in the state, and returns to the state determining phase in step S2002. On the other hand, if the state in step S2014 is not step 1 ("No" in step S2014), the determination unit 103 determines in the state determining phase in step S2002 that position variation is the reason the state is no longer state 1 (step S2015) and in step S2016, the power transmitting apparatus 100 performs antenna impedance control (hereinafter referred to as "antenna Z control").

If there is variation in the load amount ("Yes" in step S2005), the detection unit 102 checks whether or not the antennas have been matched (step S2006). This is for eliminating the possibility that there has been an error in antenna matching, or in other words, that variation in the position of the power receiving apparatus 109 has occurred in the same period as the load amount variation, and for enabling the drain voltage Vdd of the class E amplifier to be controlled more accurately with respect to the variation in the load amount. If there has been an error in the matching of the antennas ("No" in step S2006), the power transmitting apparatus 100 performs antenna Z control (step S2007). It is conceivable that conversion or the like based on a circulator (not shown), AC voltage, or an ammeter is used for the antenna impedance detection in step S2016, step S2006, and step S2007. Also, the antenna impedance may be detected using a different method. After the antenna Z control (step S2007, S2016), the determination unit 103 once again performs state determination (step S2008). Here, if there is no change in the load amount and the power transmission efficiency does not change after the antenna Z control performed by the position variation, the state is state 1 ("Yes" in step S2009). In this case, the power transmitting apparatus 100 does not need to adjust the drain voltage Vdd of the class E amplifier 106.

Figure 22A:
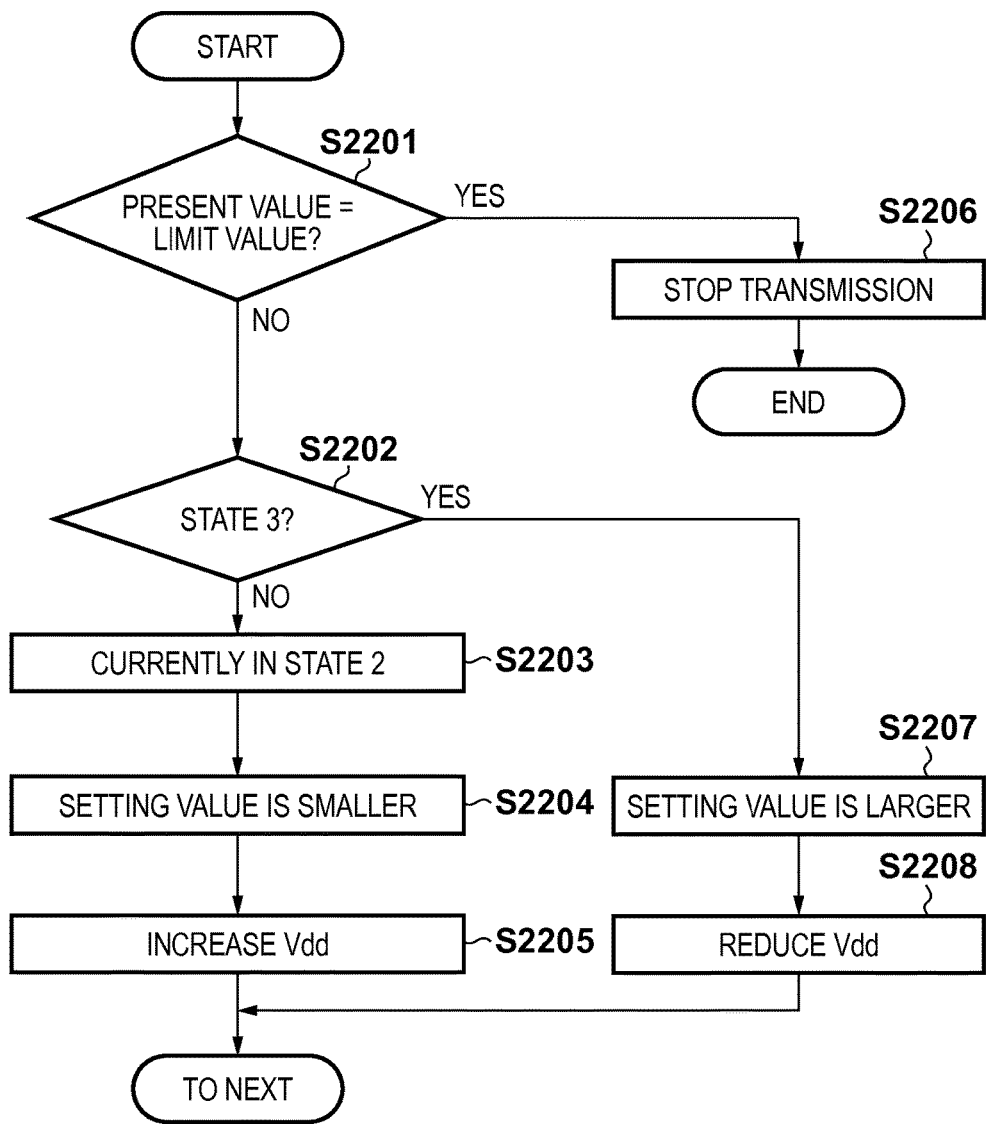
FIGS. 22A and 22B are flowcharts (3) showing operations of the power transmitting apparatus according to the third embodiment.

If it is determined in step S2009 that it is not state 1 ("No" in step S2009), the procedure moves to the Vdd adjusting phase in step S2010. FIG. 22A shows the details of the Vdd adjusting phase. If the present value of Vdd is the limit value ("Yes" in step S2201), the power transmitting apparatus 100 stops power transmission (step S2206) and the processing ends. The Vdd adjusting phase corresponds to state 2 or state 3. If the state is state 3 ("Yes" in step S2022), the setting value is larger (step S2207), and therefore the power transmitting apparatus 100 reduces Vdd (step S2208). If the state is not state 3 ("No" in step S2022), the state is state 2 (step S2203) and it is determined that the setting value is smaller (step S2204), and therefore the power transmitting apparatus 100 increases the Vdd (step S2205).

Figure 22B:
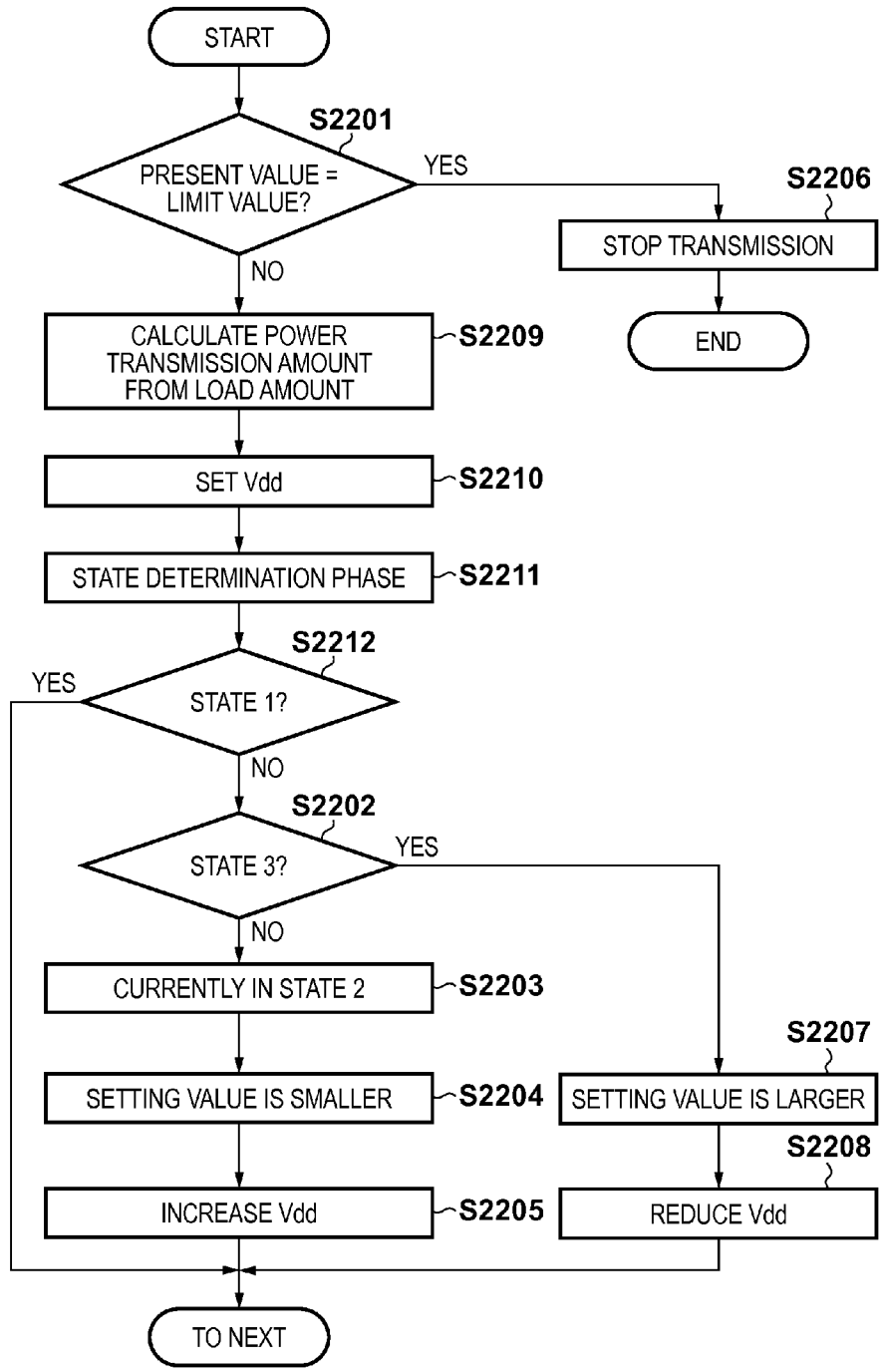
Figure 23:
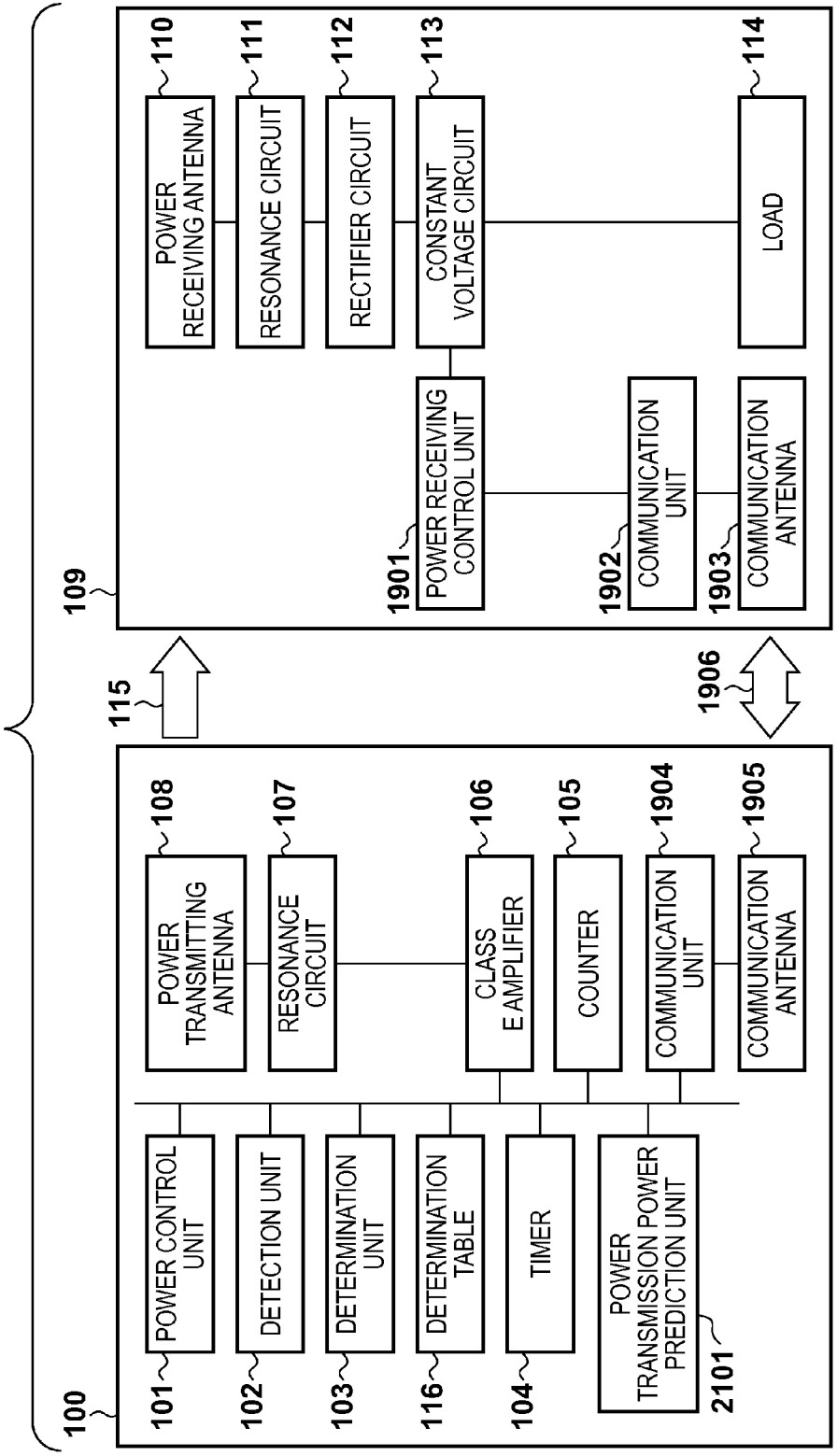
FIG. 23 is a diagram showing a modified example of the configuration of the power transmission system according to the third embodiment.

FIG. 22B shows another method for the Vdd adjusting phase. FIG. 22B includes the addition of the operations of steps S2209 to S2212 to the steps in FIG. 22A. In the present embodiment, the power transmitting apparatus 100 receives the amount of received power from the power receiving apparatus 109, and therefore the Vdd of the class E amplifier can be set if the efficiency during power transfer after the antenna Z control is known. FIG. 23 is a diagram showing the configuration of the power transmission system according to a modified example of the present embodiment. FIG.

23 is FIG. 19 including the addition of a power transmitting power prediction unit 2101 in the power transmitting apparatus 100. The power transmission power prediction unit 2101 predicts the power transmission amount (amount of power transmission power) by obtaining a value obtained by dividing the load amount of the power receiving apparatus 109 received via the communication unit 1904 by a provisional efficiency such as the efficiency that was used until the present time. In step S2209 in FIG. 22B, the power transmitting apparatus 100 uses the power transmission power prediction unit 2101 to calculate the predicted power transmission amount based on the received load amount. The power transmitting apparatus 100 sets the Vdd by calculating it based on the calculated power transmission amount (step S2210), and performs power transmission. Here, the power transmission power that was predicted by the power transmission power prediction unit 2101 can only undergo rough adjustment since the efficiency between the power transmitting apparatus and the power receiving apparatus is a provisional value. In order to determine the power transmission power more precisely, the power transmitting apparatus 100 moves once again to the state determining phase in step S2211 and adjusts the Vdd to match the determined state.

The timer 104 is provided in the power transmitting apparatus 100 in the present embodiment as well, similarly to the above-described embodiment, and after the adjustments, the outputs from the class E amplifier 106 and the constant voltage circuit 113 stabilize, or in other words, a certain amount of time elapses, whereafter the detection unit 102 and the determination unit 103 are allowed to operate (step S2002). This kind of processing prevents the antenna Z control in steps S2007 and S2016 from being performed in a transitional state where the output is not stable. Also, similarly to the other embodiment, it is possible to prevent the detection unit 102 from detecting the Zin in the transitional state where the output is not stable (step S2008 in FIG. 20), and controlling the Vdd based on that result (step S2010).

Note that in the present embodiment, the power transmitting apparatus 100 always or periodically receives the load amount from the power receiving apparatus 109 in FIG. 20, but it is possible to receive the load amount from the power receiving apparatus 109 only in the case where there is load variation while in a power receiving standby state. Also, in FIG. 19, the communication antennas 1903 and 1905 are described as having configurations different from the power transmitting antenna 108 and the power receiving antenna 110. However, power transfer and communication may be performed with the same frequency band, and a single antenna may be used as the communication antenna and the power transfer antenna. Also, in the present embodiment, the detection unit 102 detects the power source impedance of the class E amplifier. However, similarly to the other embodiment, the detection unit 102 may detect the value or the drain current Id at a timing when there is a voltage Vds between the drain and the source in the class E amplifier.

Fourth Embodiment

In the present embodiment, the power transmitting apparatus and the power receiving apparatus each have a communication means for communicating with a partner apparatus, and a description will be given for an example of control when the power transmitting apparatus performs antenna impedance matching with the power receiving apparatus. In steps S2007 and S2016 in FIG. 20, which was described in the third embodiment, the power transmitting apparatus 100 performs antenna impedance control (referred to as "antenna Z control" below). As described above, the antenna impedance seen from the power transmitting apparatus varies according to errors in the position relative to the power receiving apparatus and changes in the load on the power receiving side. Accordingly, by setting a constant load for the power receiving apparatus during the antenna Z control, it is easier to perform matching control for changes in the antenna impedance caused by errors in the position relative to the power receiving apparatus.

Figure 24:
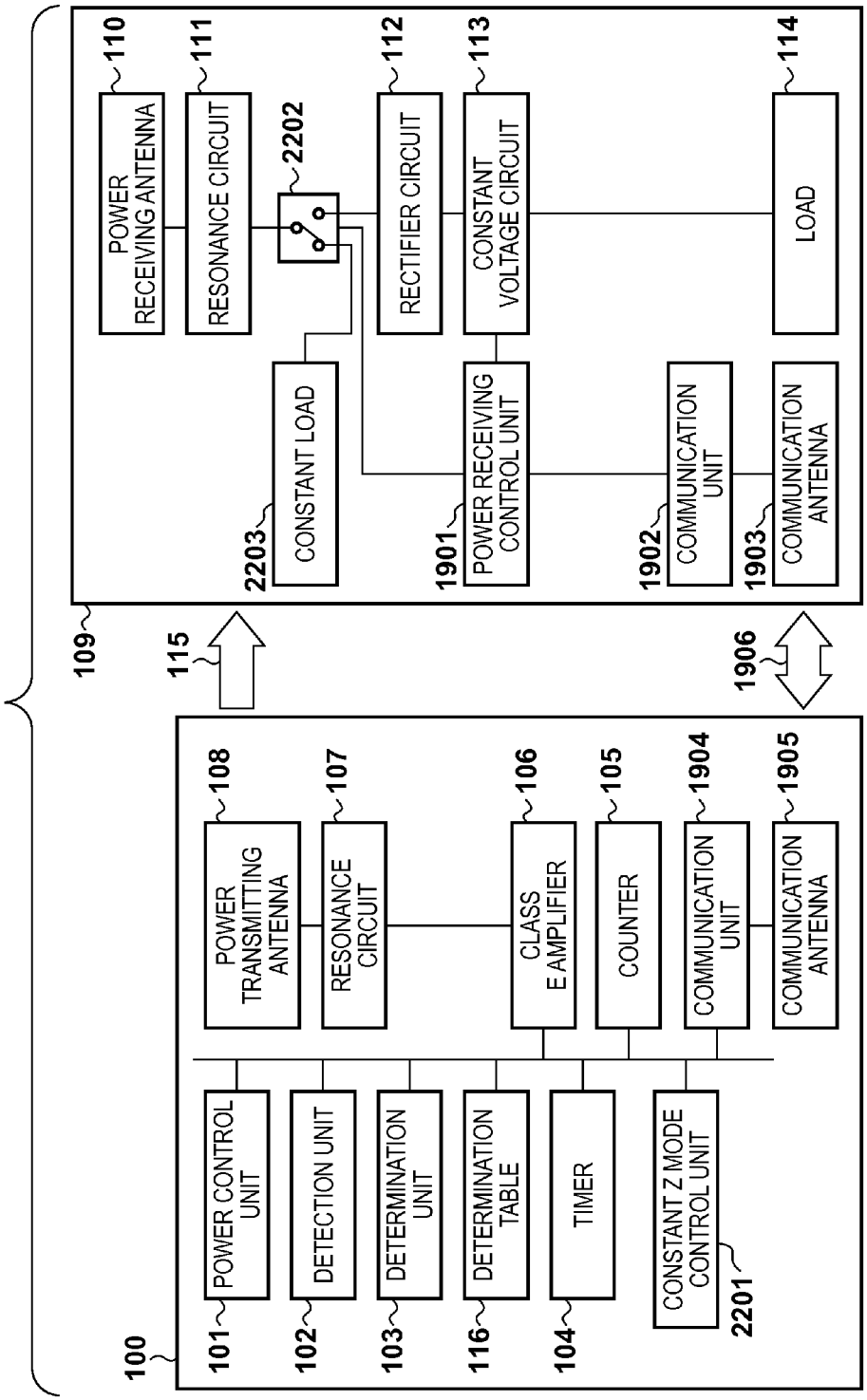
FIG. 24 is a diagram showing the state of the power transmission system according to a fourth embodiment.

FIG. 24 is a diagram showing the configuration of the power transmission system of the present embodiment. Compared with FIG. 19, the power transmitting apparatus 100 includes the addition of a constant Z mode control unit, and the power receiving apparatus 109 includes the addition of a load switching switch 2202 and a constant load 2203. As its initial value, the value of the constant load 2203 corresponds to the load impedance in the case where the power receiving apparatus 109 also receives power.

Figure 25:
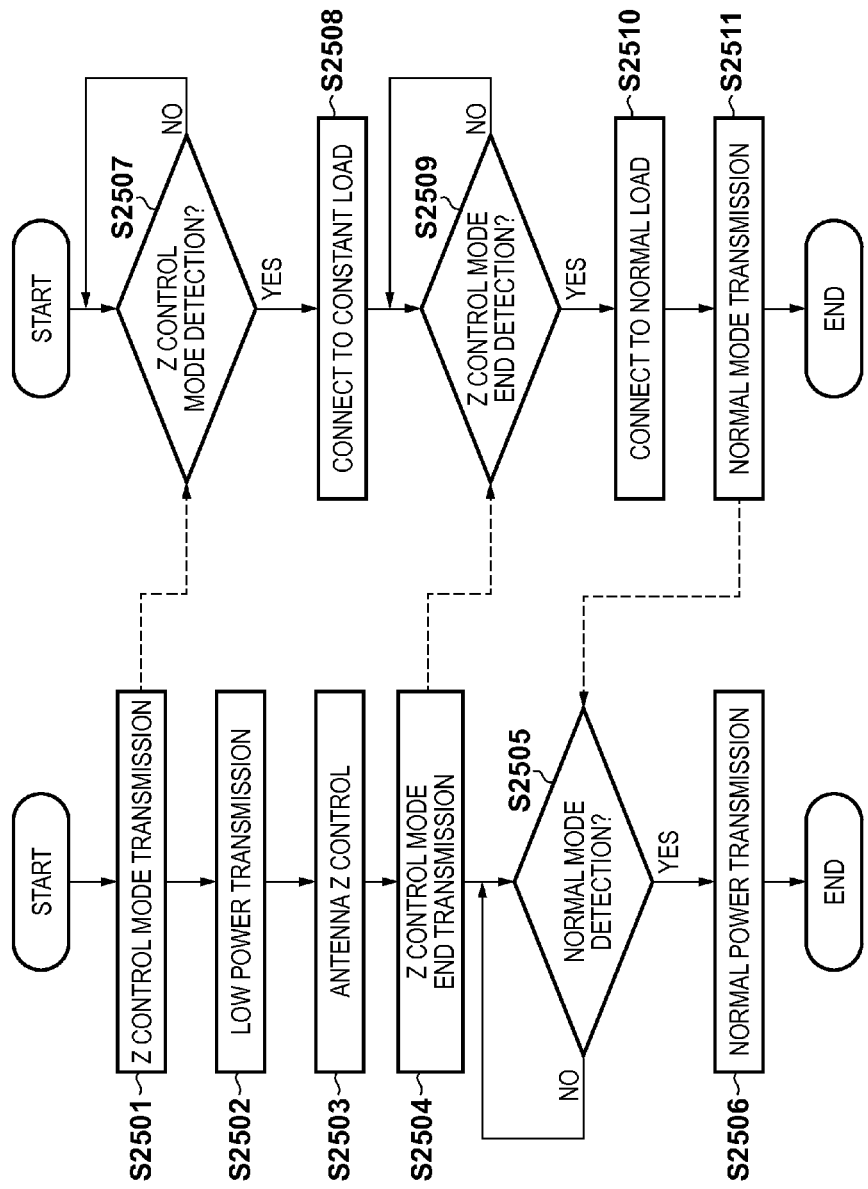
FIG. 25 is a flowchart showing an operation of the power transmitting apparatus and a power receiving apparatus according to the fourth embodiment.

FIG. 25 is a flowchart for the power transmitting apparatus 100 and the power receiving apparatus 109 during the antenna Z control in steps S2007 and S2016 in FIG. 20. When the constant Z control unit 2201 in the power transmitting apparatus 100 is activated in FIG. 25, the power transmitting apparatus 100 notifies the power receiving apparatus 109 that the antenna Z control mode will be entered (step S2501). When the power receiving apparatus 109 receives the antenna Z control mode notification ("Yes" in step S2507), the power reception control unit 1901 operates the load switching switch 2202 and connects to the constant load 2203 (step S2508). In order to perform the antenna Z control, the power transmitting apparatus 100 need only transmit the lowest amount of power by which reflections from the power receiving apparatus 109 can be detected, and therefore, after transmitting the antenna Z mode notification (step S2501), low power transmission for the antenna Z control is performed (step S2502). The power transmitting apparatus 100 separates the reflected power from the power receiving apparatus using a circulator or the like (not shown), detects it, and performs impedance matching control such that the reflected power is minimized (step S2503).

When the antenna Z control is complete, the power transmitting apparatus 100 transmits an antenna Z control mode end notification to the power receiving apparatus 109 (step S2504). When the power receiving apparatus 109 receives the antenna Z control mode end notification ("Yes" in step S2309), the power reception control unit 1901 in step S2510 operates the load switching switch 2202 to the normal value (rectifying circuit 112 in FIG. 24). The power receiving apparatus 109 switches to the normal load, and subsequently transmits a normal mode notification to the power transmitting apparatus 100 (step S2511). On the other hand, upon detecting the normal mode notification from the power receiving apparatus 109 ("Yes" in step S2505), the power transmitting apparatus 100 starts normal power transmission and the antenna Z control mode is complete.

As described above, if communication is to be performed between a power transmitting apparatus and a power receiving apparatus, the influence of antenna impedance variation caused by power reception load variation can be avoided by switching the power receiving apparatus to a constant load at the time of antenna Z control. By employing this embodiment, easier matching control is possible with respect to antenna impedance changes caused by position error in the relative positions of the power transmitting apparatus and the power receiving apparatus.

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiments of the present invention, and by a method performed by the computer of the system or apparatus by, for example, reading out and executing the computer executable instructions from the storage medium to perform the functions of one or more of the above-described embodiments. The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-078989, filed Apr. 4, 2013, and No. 2014-041944, filed Mar. 4, 2014, which are hereby incorporated by reference herein in their entirety.

What is claimed is:

1. A power transmitting apparatus that performs power transmission to a power receiving apparatus, the power transmission apparatus comprising:
    an amplifier that includes a switching element;
    a detection unit configured to detect a value for evaluating the efficiency of the amplifier at a time when the switching element transitions from an off state to an on state; and
    a power control unit configured to increase a voltage supplied to the amplifier in a case where the value for evaluating the efficiency of the amplifier that was detected by the detection unit indicates a second state in which the efficiency of the amplifier is less than an efficiency of the amplifier in a first state and to decrease the voltage supplied to the amplifier in a case where the value for evaluating the efficiency of the amplifier that was detected by the detection unit indicates a third state in which the efficiency of the amplifier is less than the efficiency of the amplifier in the first state,
    wherein the power control unit is further configured to maintain the voltage supplied to the amplifier in a case where the value for evaluating the efficiency of the amplifier that was detected by the detection unit indicates the first state.

2. The power transmitting apparatus according to claim 1, wherein the detection unit is further configured to detect the value for evaluating the efficiency based on an output waveform from the switching element in the amplifier up to when the switching element transitions from the off state to the on state.

3. The power transmitting apparatus according to claim 1, wherein the value for evaluating the efficiency is a voltage value output by the switching element in the amplifier.

4. The power transmitting apparatus according to claim 1, wherein the value for evaluating the efficiency is a current value output by the switching element in the amplifier.

5. The power transmitting apparatus according to claim 1, wherein the detection unit is further configured to detect, as the value for evaluating the efficiency, the local maximum value among the voltage values output by the switching element in the amplifier up to when the switching element transitions from the off state to the on state, or the time at which the local maximum value was output.

6. The power transmitting apparatus according to claim 1, wherein the detection unit is further configured to detect, as the value for evaluating the efficiency, an input impedance of the amplifier up to when the switching element in the amplifier transitions from the off state to the on state.

7. The power transmitting apparatus according to claim 1, further comprising:
    a determination unit configured to determine the voltage that is to be supplied to the amplifier based on a result detected by the detection unit,
    wherein the power control unit increases or decreases the voltage that is to be supplied to the amplifier in accordance with the voltage determined by the determination unit.

8. The power transmitting apparatus according to claim 1, further comprising:
    a matching unit configured to remove the influence of variation in the distance between the power transmitting apparatus and the power receiving apparatus,
    wherein after the influence is removed by the matching unit, the detection unit detects the value for evaluating the efficiency of the amplifier.

9. The power transmitting apparatus according to claim 1, further comprising:
    a communication unit configured to communicate with the power receiving apparatus,
    wherein the power control unit, based on the power consumption of the load in the power receiving apparatus received by the communication unit, increases or decreases the voltage that is to be supplied to the amplifier.

10. A control method of a power transmitting apparatus that performs power transmission to a power receiving apparatus having an amplifier that includes a switching element, comprising:
    detecting a value for evaluating the efficiency of the amplifier at a time when the switching element transitions from an off state to an on state; and
    increasing a voltage supplied to the amplifier in response to the detected value for evaluating the efficiency of the amplifier indicating a second state in which the efficiency of the amplifier is less than an efficiency of the amplifier in a first state;
    decreasing the voltage supplied to the amplifier in response to the detected value for evaluating the efficiency of the amplifier indicating a third state in which the efficiency of the amplifier is less than the efficiency of the amplifier in the first state; and maintaining the voltage supplied to the amplifier in response to the detected value for evaluating the efficiency of the amplifier indicating the first state.

11. A non-transitory computer readable storage medium storing a program that causes a computer to execute a control method of a power transmitting apparatus that performs power transmission to a power receiving apparatus having an amplifier that includes a switching element, the method comprising:
  detecting a value for evaluating the efficiency of the amplifier at a time when the switching element transitions from an off state to an on state; and
  increasing a voltage supplied to the amplifier in response to the detected value for evaluating the efficiency of the amplifier indicating a second state in which the efficiency of the amplifier is less than an efficiency of the amplifier in a first state;
  decreasing the voltage supplied to the amplifier in response to the detected value for evaluating the efficiency of the amplifier indicating a third state in which the efficiency of the amplifier is less than the efficiency of the amplifier in the first state; and
  maintaining the voltage supplied to the amplifier in response to the detected value for evaluating the efficiency of the amplifier indicating the first state.

12. A power transmitting apparatus that performs power transmission to a power receiving apparatus, the power transmission apparatus comprising:
  an amplifier that includes a switching element;
  a detector configured to detect a value for evaluating the efficiency of the amplifier at a time when the switching element transitions from an off state to an on state; and
  a power controller configured to increase a voltage supplied to the amplifier in a case where the value for evaluating the efficiency of the amplifier that was detected by the detector indicates a second state in which the efficiency of the amplifier is less than an efficiency of the amplifier in a first state and to decrease the voltage supplied to the amplifier in a case where the value for evaluating the efficiency of the amplifier that was detected by the detector indicates a third state in which the efficiency of the amplifier is less than the efficiency of the amplifier in the first state,
  wherein the power controller is further configured to maintain the voltage supplied to the amplifier in a case where the value for evaluating the efficiency of the amplifier that was detected by the detector indicates the first state.

13. A power transmitting apparatus that performs power transmission to a power receiving apparatus, the power transmitting apparatus comprising:
  an amplifier that switches a DC voltage supplied to the amplifier using a pulse and converts the DC voltage to an AC voltage;
  a power transmitting unit configured to transmit power using an output from the amplifier to the power receiving apparatus;
  a detecting unit configured to detect a value indicating whether degradation of power transmission efficiency of the power transmitting unit, caused by switching loss of the amplifier, exists; and
  a control unit configured to increase the DC voltage supplied to the amplifier in a case where the value indicating whether degradation of power transmission efficiency exists that was detected by the detecting unit indicates a second state in which the power transmission efficiency of the amplifier is less than the power transmission efficiency of the amplifier in a first state and to decrease the DC voltage supplied to the amplifier in a case where the value indicating whether degradation of power transmission efficiency exists that was detected by the detecting unit indicates a third state in which the power transmission efficiency of the amplifier is less than the power transmission efficiency of the amplifier in the first state,
  wherein the control unit is further configured to maintain the DC voltage supplied to the amplifier in a case where the value indicating whether degradation of power transmission efficiency exists that was detected by the detecting unit indicates the first state.

14. The power transmitting apparatus according to claim 13, wherein the detecting unit detects the degradation of the power transmission efficiency of the power transmitting unit, caused by the switching loss of the amplifier, based on at least one of an impedance, a power, and a current.

15. The power transmitting apparatus according to claim 13, wherein the amplifier converts the input DC voltage to the AC voltage with the highest efficiency in a case where a value obtained by dividing the input DC voltage by an input current is a predetermined value, and the control unit decreases the input DC voltage in a case a value obtained by dividing the input voltage by the input current is larger than the predetermined value.

16. The power transmitting apparatus according to claim 13, wherein the amplifier converts the input DC voltage to the AC voltage with the highest efficiency in a case where a value obtained by dividing the input DC voltage by an input current is a predetermined value, and the control unit increases the input DC voltage in a case a value obtained by dividing the input voltage by the input current is smaller than the predetermined value.

17. The power transmitting apparatus according to claim 13, wherein the amplifier is a class E amplifier.

18. The power transmitting apparatus according to claim 1, wherein the power control unit is further configured to increment a counter in the case where the value for evaluating the efficiency of the amplifier that was detected by the detection unit indicates the second state or the third state, compare a current value of the counter with a limit value, and stop power transmission in response to the current value of the counter being equal to the limit value.

* * * * *